United States Patent
Ito et al.

(10) Patent No.: US 7,328,422 B2
(45) Date of Patent: Feb. 5, 2008

(54) DESIGN SUPPORT APPARATUS, DESIGN SUPPORT PROGRAM AND DESIGN SUPPORT METHOD FOR SUPPORTING DESIGN OF SEMICONDUCTOR INTEGRATED CIRCUIT

(75) Inventors: Noriyuki Ito, Kawasaki (JP); Ryoichi Yamashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 306 days.

(21) Appl. No.: 11/059,556

(22) Filed: Feb. 17, 2005

(65) Prior Publication Data

US 2006/0112365 A1 May 25, 2006

(30) Foreign Application Priority Data

Nov. 19, 2004 (JP) .............................. 2004-336329

(51) Int. Cl.
G07F 17/50 (2006.01)
(52) U.S. Cl. .............................. 716/14; 716/12; 716/13
(58) Field of Classification Search .................... 716/2, 716/7–14
See application file for complete search history.

(56) References Cited

U.S. PATENT DOCUMENTS

| 6,262,487 | B1 | 7/2001 | Igarashi et al. |
| 6,436,804 | B2 | 8/2002 | Igarashi et al. |
| 6,645,842 | B2 | 11/2003 | Igarashi et al. |
| 6,858,928 | B1* | 2/2005 | Teig et al. ................... 257/700 |
| 7,155,697 | B2* | 12/2006 | Teig et al. ..................... 716/13 |
| 2006/0248492 | A1* | 11/2006 | Hetzel .......................... 716/14 |

FOREIGN PATENT DOCUMENTS

| JP | 1-112749 | 5/1989 |
| JP | 2-216533 | 8/1990 |
| JP | 5-243379 | 9/1993 |
| JP | 2000-82743 | 3/2000 |

* cited by examiner

Primary Examiner—Vuthe Siek
(74) Attorney, Agent, or Firm—Staas & Halsey LLP

(57) ABSTRACT

A design support apparatus is provided, including control portion executes layout program to implement a position judging section which performs position judgment to check, for every net, the net being formed by a first cell to be called 'driver' and one or a plurality of cells driven via an output terminal of the first cell to be called 'receiver(s)', whether or not said driver exists outside a predetermined region for enclosing said receiver(s), and a layout section which determines a base point from an inside of said predetermined region, with respect to said net where it is judged that said driver exists outside said predetermined region, and arranges said diagonal wiring for wiring which connects said output terminal of said driver with said base point when said base point can be connected with an input terminal of said receiver by means of vertical and/or horizontal wiring.

47 Claims, 24 Drawing Sheets

| CELL | INPUT TERMINAL COORDINATES | OUTPUT TERMINAL COORDINATES |
|---|---|---|
| CEL1 | (x1in, y1in) | (x1out, y1out) |
| CEL2 | (x2in, y2in) | (x2out, y2out) |
| ... | | |

Fig. 4A

| NET | DRIVER | RECEIVER |
|---|---|---|
| N1 | CEL1 | CEL2, CEL5, CEL6 |
| N2 | CEL2 | CEL3, CEL4 |
| ... | | |

Fig. 4B

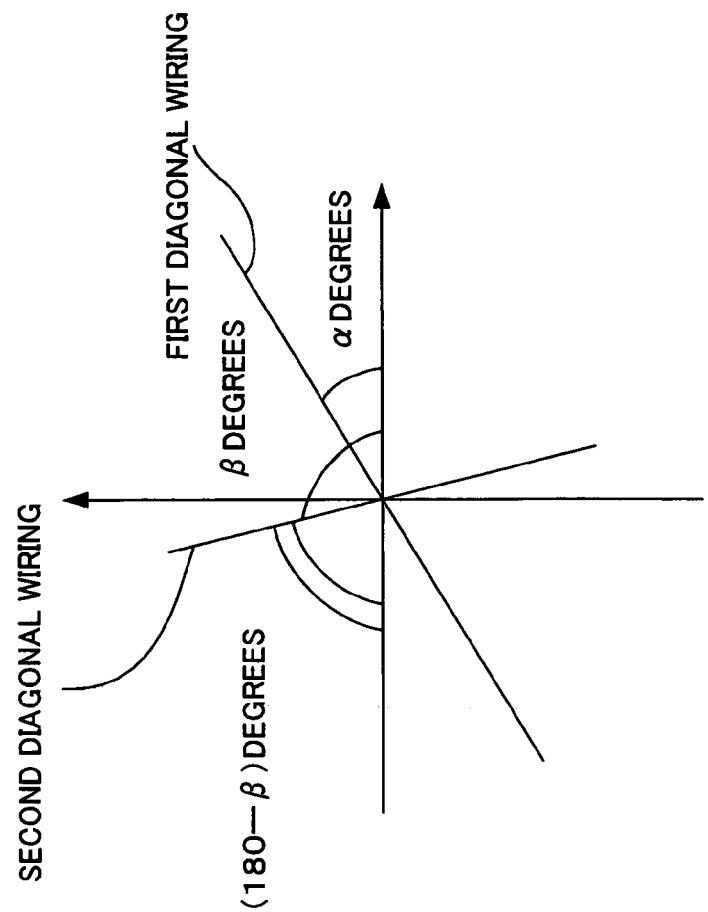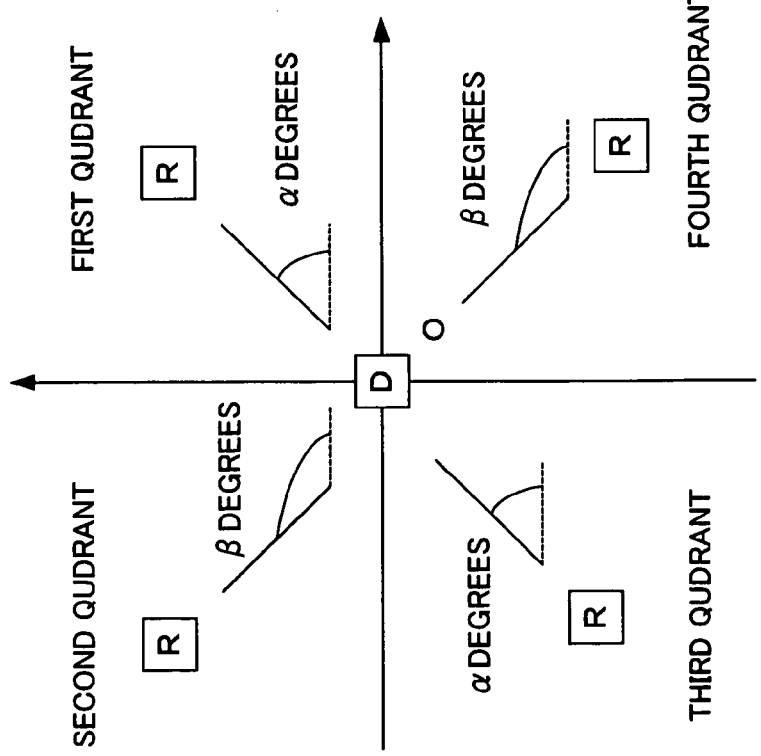
Fig. 5B
Fig. 5A

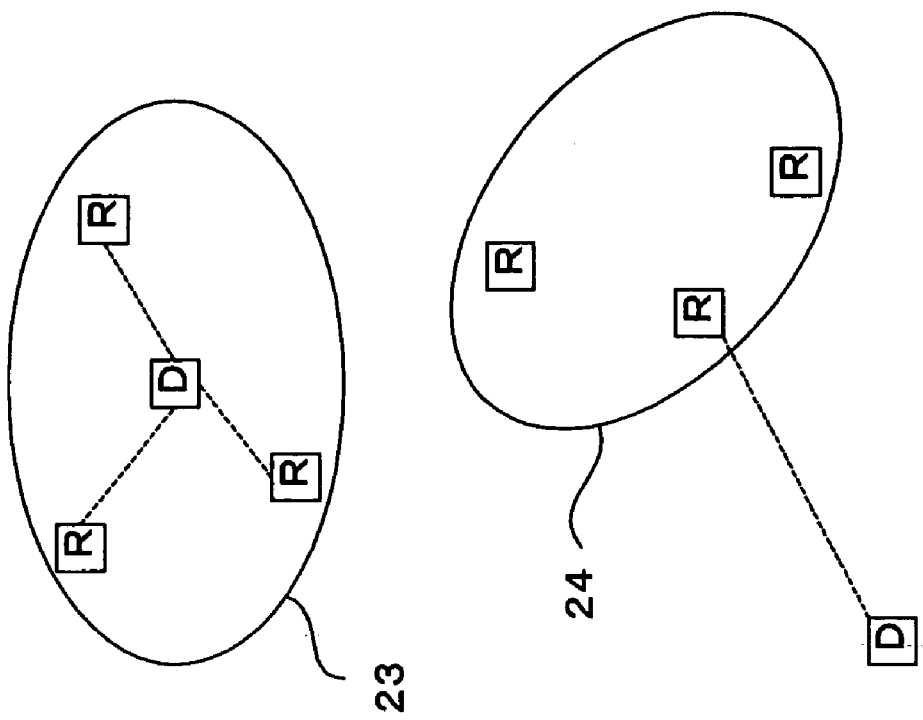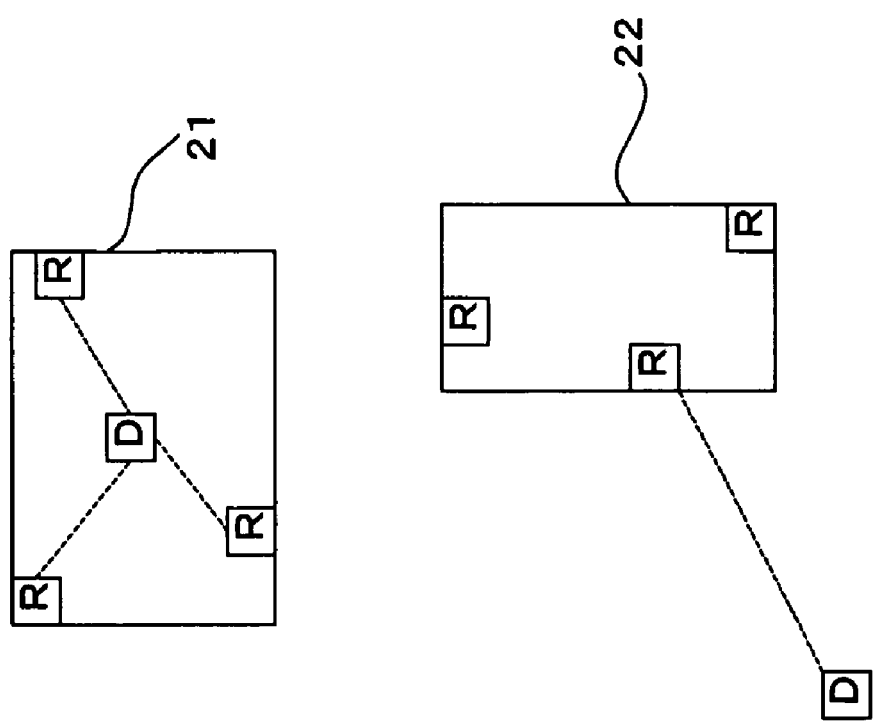

Fig. 14

| LAYER | TYPE | POSITION |
|---|---|---|
| L1 | USED | R1: {y=y1、x1≦x≦x2}、<br>R2: {x3≦x≦x4、y2≦y≦y3} |
| L1 | OBSTRUCTION | P1: (x5、y5) |
| ... | ... | ... |

Fig. 18

| NET | DELAY TIME |
|-----|------------|
| N1  | T1         |
| N2  | T2         |
| ... | ...        |

Fig. 20

| RANKING POSITION | NET |
|---|---|
| 1 | N3 |
| 2 | N1 |
| ... | ... |

DESIGN SUPPORT APPARATUS, DESIGN SUPPORT PROGRAM AND DESIGN SUPPORT METHOD FOR SUPPORTING DESIGN OF SEMICONDUCTOR INTEGRATED CIRCUIT

BACKGROUND OF THE INVENTION

1. Field of the Invention

The present invention relates to a design support apparatus, design support method and design support program for supporting a design of a semiconductor integrated circuit, and, in particular, relates to a design support apparatus and the like for supporting design when using diagonal wiring to make connections between cells (formed by combining a plurality of logical gates to implement different functions) contained in a semiconductor integrated circuit.

2. Description of the Related Art

Generally, wiring in a semiconductor integrated circuit is performed after arranging, on a silicon wafer as a substrate, cells (e.g. a flipflop, counter, selector, multiplexer, adder, etc.) for combining a plurality of logical gates to implement different functions. A semiconductor integrated circuit has a multilayer structure where several wiring layers, such as aluminum or the like, are superimposed on top of one another, in which an output terminal of a certain semiconductor device contacting the bottom layer is connected with an input terminal of another semiconductor device by using these wiring layers.

In each of the wiring layers, there is arranged vertical wiring or horizontal wiring when viewing from the top of the wiring layers. Recently, however, in addition to vertical or horizontal wiring, there has been suggested a semiconductor integrated circuit in which wiring in a diagonal direction (e.g. 45 degree direction, 135 degree direction) is used. According to Japanese Patent Application Laid-Open No. H5-243379, for example, there is proposed a semiconductor integrated circuit device for reducing a wiring region by means of multilevel wiring including diagonal wiring. According to Japanese Patent Application Laid-Open No. 2000-82743, there is proposed a semiconductor integrated circuit device in which the positions of connection holes for connecting the wiring layers with each other are adjusted when using diagonal wiring. Also according to Japanese Patent Application Laid-Open No. H1-112749, there is proposed a semiconductor integrate circuit in which the pitch interval between the diagonal wiring is made to have a predetermined length, whereby cosstalk is prevented.

When designing a semiconductor integrated circuit, a designer uses an information processing device, such as a PC (personal computer) and the like, and dedicated software tools to represent the state where the cells are arranged on a substrate. Wiring between the cells planned in the designing step is performed manually by the designer, or automatically by the dedicated tools.

SUMMARY OF THE INVENTION

In a conventional technology, however, there was no definite standard or effective judgment technique for determining to which path diagonal wiring should be applied, of a plurality of paths for connecting the cells. Consequently, there were problems that it had to end up in diverting the vertical or horizontal wiring (conventional wiring) by needlessly arranging diagonal wiring, or that it was inevitable to increase the number of wiring layers to prevent the conventional wiring to be diverted. Further, diagonal wiring was often applied to a path where there was no reason to do so. Therefore, designing by effectively utilizing diagonal wiring had not been carried out.

An object of the present invention therefore is to provide a design support apparatus, a relevant program, and a design support method that can perform wiring design between the cells by effectively utilizing diagonal wiring.

As a first aspect of the present invention, a design support apparatus supporting a design of an integrated circuit which includes a plurality of cells to implement different functions by combining a plurality of logical gates, contains: a storage portion in which is stored a layout program which determines a wiring layout when connecting the plurality of cells by means of diagonal wiring whose inclination is determined beforehand; and a control portion which reads and executes said layout program from said storage portion. The storage portion further contains position information for specifying a position in which said plurality of cells are arranged. The control portion executes said layout program to implement: a position judging section which performs position judgment to check, for every net, the net being formed by a first cell to be called 'driver' and one or a plurality of cells driven via an output terminal of the first cell to be called 'receiver(s)', whether or not said driver exists outside a predetermined region for enclosing said receiver (s); and a layout section which determines a base point from an inside of said predetermined region, with respect to said net where it is judged that said driver exists outside said predetermined region, and arranges said diagonal wiring for wiring which connects said output terminal of said driver with said base point when said base point can be connected with an input terminal of said receiver by means of vertical and/or horizontal wiring.

According to a more preferred embodiment in the first aspect of the invention, said control portion further executes said layout program to implement a search section which determines the direction of wiring adjacent to said diagonal wiring as vertical or horizontal wiring, based on an inclination of a line segment that connects said output terminal of said driver with said base point, and on an inclination of said diagonal wiring, and which performs a search to find a range in which said diagonal wiring can be arranged by moving said diagonal wiring in parallel in said determined adjacent wiring direction. The layout section assumes that said diagonal wiring is temporarily arranged in a position selected in said searched range, performs connection judgment to check if it is possible to connect, of the two end points of said temporarily arranged diagonal wiring, an end point near said driver with said output terminal of said driver, and an end point near said base point with said base point, by means of vertical and/or horizontal wiring, and arranges said diagonal wiring in the selected position if it is possible to make said connection.

According to a more preferred embodiment in the first aspect of the invention, the search section starts said search by taking a length of said diagonal wiring as a preset predetermined initial value. When there is no range in which said diagonal wiring can be arranged, said search section makes the length of said diagonal wiring shorter than said predetermined initial value, and performs a search again.

According to a more preferred embodiment in the first aspect of the invention, when said driver is connected with said receivers by means of vertical and/or horizontal wiring, a delay time generated in each path between said driver and said receiver is calculated for said every net. And said position judging section takes as an object of said position judgment, of said plurality of nets, said net having said path in which said delay time is at least a second threshold.

According to a more preferred embodiment in the first aspect of the invention, said wiring layout is determined in a two-dimensional plane formed by the x- and y-axes that are mutually perpendicular. The diagonal wiring has first diagonal wiring making a α-degree angle (0<α<90) with respect to said x-axis, and second diagonal wiring making a β-degree angle (90<β<180) with respect to said x-axis. And the layout section uses said first diagonal wiring if an angle made by a line segment connecting said output terminal of said driver with said base point with respect to said x-axis is larger than 0 degree and smaller than 90 degrees, and uses said second diagonal wiring if the angle made by the line segment with respect to said x-axis is larger than 90 degrees.

Further, as a second aspect, the abovementioned object is achieved by providing a computer-readable medium storing a program executed by a computer for determining a wiring layout of an integrated circuit which includes a plurality of cells to implement different functions by combining a plurality of logical gates when connecting the plurality of cells by means of diagonal wiring whose inclination is determined beforehand. The program causes the computer to execute a method containing: performing position judgment to check, for every net, the net being formed by a first cell to be called 'driver' and one or a plurality of cells driven via an output terminal of the first cell to be called 'receiver(s)', whether or not said driver exists outside a predetermined region for enclosing said receiver(s), based on position information stored in advance for specifying a position where said plurality of cells are arranged; determining a base point from an inside of said predetermined region, with respect to said net where it is judged that said driver exists outside said predetermined region; and arranging said diagonal wiring for wiring which connects said output terminal of said driver with said base point when said base point can be connected with an input terminal of said receiver by means of vertical and/or horizontal wiring.

Furthermore, as a third aspect, the abovementioned object is achieved by providing a design support method for determining a wiring layout of an integrated circuit which includes a plurality of cells to implement different functions by combining a plurality of logical gates when connecting the plurality of cells by means of diagonal wiring whose inclination is determined beforehand. The design support method includes: performing position judgment to check, for every net, the net being formed by a first cell to be called 'driver' and one or a plurality of cells driven via an output terminal of the first cell to be called 'receiver(s)', whether or not said driver exists outside a predetermined region for enclosing said receiver(s),based on position information stored in advance for specifying a position where said plurality of cells are arranged; determining a base point from an inside of said predetermined region, with respect to said net where it is judged that said driver exists outside said predetermined region; and arranging said diagonal wiring for wiring which connects said output terminal of said driver with said base point when said base point can be connected with an input terminal of said receiver by means of vertical and/or horizontal wiring.

According to the present invention, in nets where drivers are positioned outside a group of receivers, diagonal wiring is arranged to connect each driver with each receiver, and it is not necessary to use a plurality of types of diagonal wiring in a single net, thus efficient wiring is possible. Consequently, it is possible to design wiring between the cells by effectively utilizing the diagonal wiring.

BRIEF DESCRIPTION OF THE DRAWINGS

FIG. 4A is a data configuration example of cell information stored in a storage portion;

FIG. 4B is a data configuration example of information specifying a drive relationship, the information being stored in a storage portion 13;

FIG. 5A is a figure for explaining diagonal wiring which is commonly used in the description of an embodiment;

FIG. 5B is a figure showing the relationship between first diagonal wiring and second diagonal wiring;

FIG. 9 is a set of figures for explaining an example of position judgment, FIG. 9A showing a case in which a rectangle is used as a predetermined region, and FIG. 9B showing a case in which an ellipse is used as the predetermined region;

FIG. 14 is a data configuration example of a table which has stored therein the position information on a place with obstruction and a used place is stored on the basis of wiring layers;

FIG. 18 is a data configuration example of a delay time table;

FIG. 20 is a data configuration example of a table showing ranking positions;

DESCRIPTION OF THE PREFERRED EMBODIMENTS

Embodiments of the present invention will now be described hereinbelow with reference to the drawings. However, the technical field of the present invention is not limited to the embodiments, but ranges to the inventions described in the patent claims and to the equivalent subjects thereof.

Figure 1:
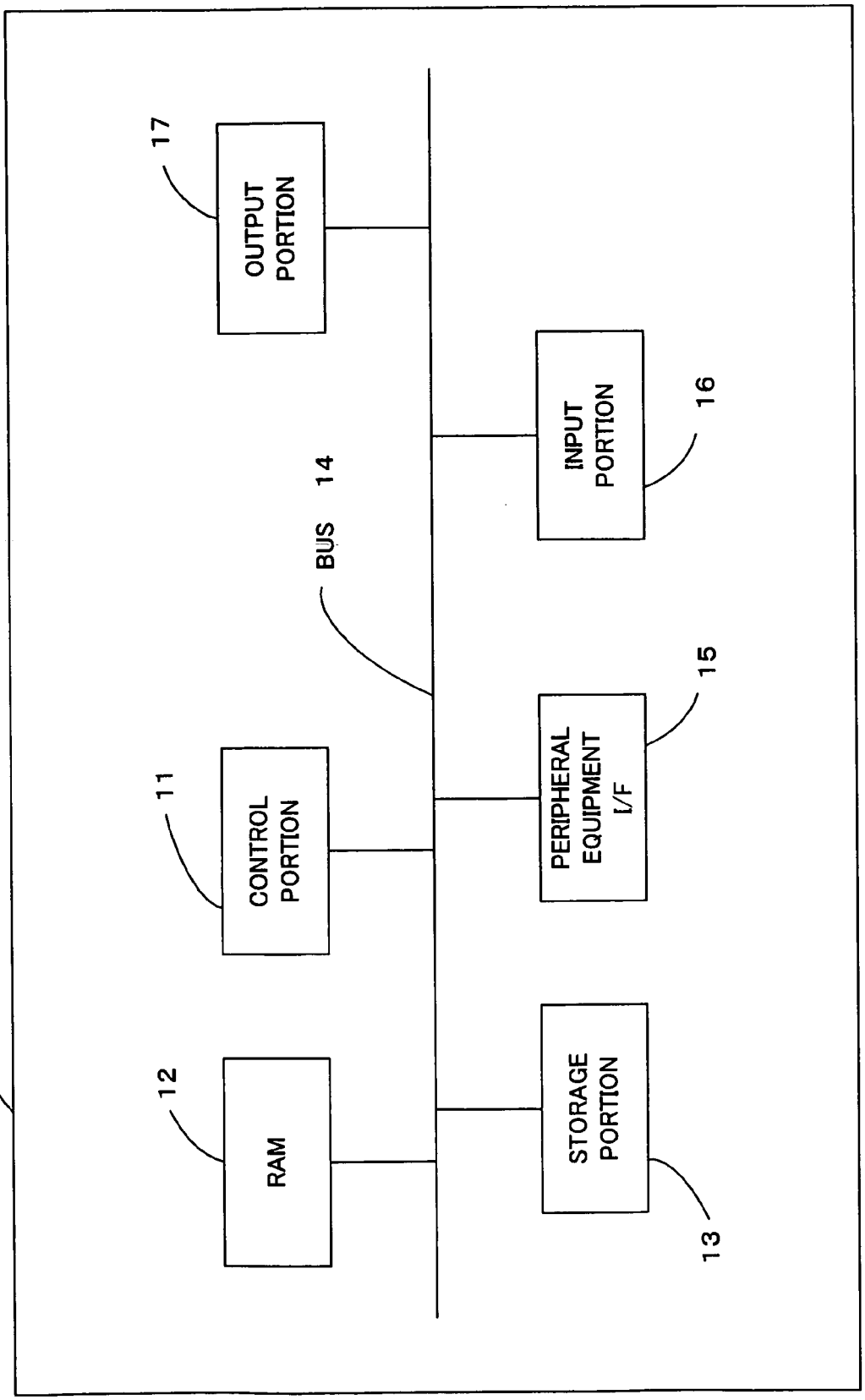
FIG. 1 is a configuration block diagram of a design support apparatus 1 in an embodiment of the present invention.

FIG. 1 is a configuration block diagram of a design support apparatus 1 of an embodiment of the present invention. The design support apparatus 1 is an information processing device, such as a desktop PC, notebook PC, PDA(Personal Digital Assistance), server, work station or the like, and has devices that are connected with each other via a bus 14, such as a control portion 11, RAM (Random Access Memory) 12, storage portion 13, interface for connecting peripheral equipment (peripheral equipment I/F) 15, input portion 16 into which information is inputted, and output portion 17 for outputting the information and providing the information to a user.

The control portion 11 includes a CPU (Central Processing Unit) which is not shown, and executes a program stored in the RAM 12 to control the various portions contained in the design support apparatus 1. The RAM 12 is the storing means in which computation results or the programs in the processing of the design support apparatus 1 are temporarily stored. The storage portion 13 is the non-volatile storing means, such as a hard disk, optical disk, magnetic disk, flash memory and the like, where various data and a program, such as an OS (Operating System) before being read to the RAM 12, are stored.

The peripheral equipment I/F 15 is an interface, such as a parallel port, USB (Universal Serial Bus) port, PCI card slot and the like, for connecting the peripheral equipment with the design support apparatus 1. The peripheral equipment include a printer, TV tuner, SCSI (Small Computer System Interface) equipment, audio equipment, a drive device, memory card reader/writer, network interface card, wireless LAN card, modem card, keyboard, mouse, display device and the like. The connection pattern between the peripheral equipment and the design support apparatus 1 may be wired or wireless connection.

The output portion 17 is the output means for outputting information to be provided to a user, and may be display means, such as a CRT (Cathode Ray Tube), crystal display and the like, for providing the user with information, or may be a speaker or the like for passing on the instructions and information to the user by reading them out. The input portion 16 is the input means, such as a keyboard, mouse and the like, with which a user's request is inputted. Further, the design support apparatus 1 often has a drive device for reading a storage medium, such as a CD (Compact Disk), DVD (Digital Versatile Disk), MO (Magneto-Optical) disk and the like. By using the drive device, the information stored in the storage medium is read and inputted to the design support apparatus 1. In other words, the drive device also functions as the input portion 16.

Figure 2:
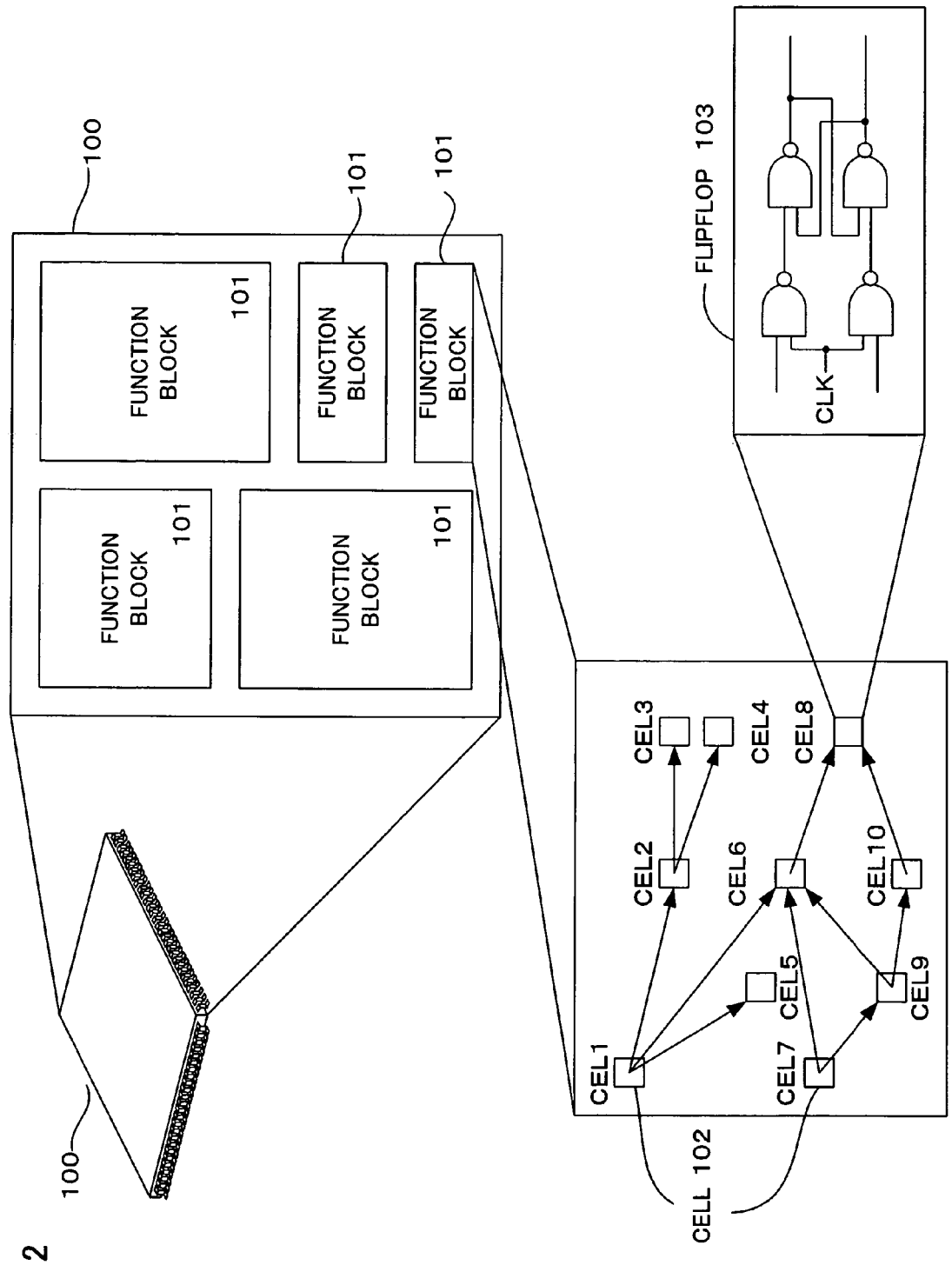
FIG. 2 is a figure for explaining a semiconductor integrated circuit which is an object of supporting design.

FIG. 2 is a figure for explaining a semiconductor integrated circuit which is an object of supporting design. A semiconductor integrated circuit 100 is composed of a plurality of function blocks 101. The function block 101 is a circuit where approximately a hundred thousand to a million semiconductor elements, such as microprocessors, MPEG (Moving Picture Experts Group) decoders, SRAM (Static Random Access Memory), ROM (Read Only Memory), input/output circuits, ASICs (Application Specific Integrated Circuit) and the like, are integrated.

Each of the function blocks 101 contains a plurality of cells 102. The cell 102 is a circuit where approximately a hundred to a thousand semiconductor elements, such as flipflops, selectors, multiplexers, counters and the like, are integrated. The cell 102 holds several to several tens of logical gates. As an example of the cell 102, a flipflop 103 composed of four logical gates is illustrated in FIG. 2.

The cell 102 has an input terminal and an output terminal, whereby a drive relationship with other cell 102 is established. "Drive relationship between the cells" means that the output terminal of a certain cell is connected with the input terminal of another cell.

Figure 3A:
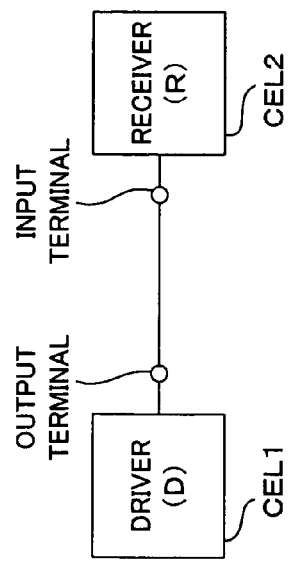
FIG. 3A is a figure for explaining drive of the cells.

FIG. 3A is a figure for explaining drive relationship of the cells. In FIG. 3A, the output terminal of a cell CEL 1 is connected with the input terminal of a cell CEL 2, and the cell CEL 1 drives the cell CEL 2. At this moment, the cell CEL 1, which is to drive, is called "a driver", and the cell CEL 2, which is to be driven is called "a receiver".

Figure 3B:
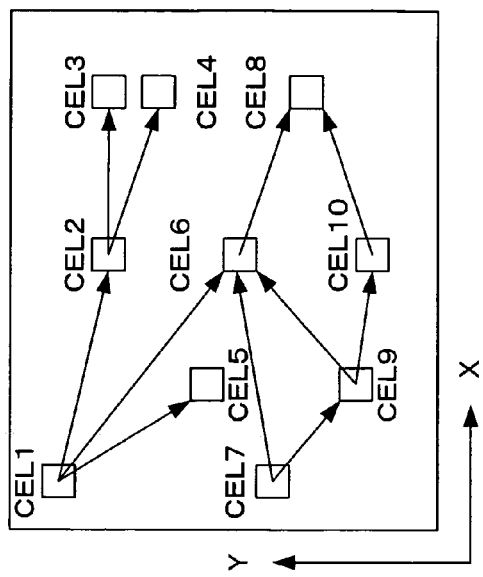
FIG. 3B is a figure for explaining an example of the drive relationship between the cells.

FIG. 3B is figure for explaining an example of the drive relationship between the cells. As indicated by the arrows in FIG. 3B, settings are configured for the cell 102 arranged in the semiconductor integrated circuit, such that which cell the cell 102 is to drive or by which cell the cell 102 is driven. For example, the cell CEL 2 in FIG. 2 is driven by the cell CEL 1, and, at the same time, drives a cell CEL 3 and a cell CEL 4. Thus, one or a plurality of receivers correspond to a single driver.

Figure 3C:
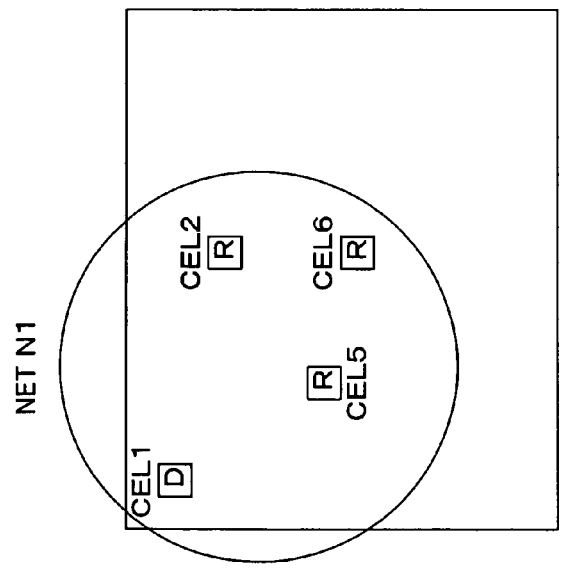
FIG. 3C is a figure showing a net which puts together the driver and receivers.

FIG. 3C is a figure showing a net in which a net which puts together the driver and receivers driven by the driver. As described above, one or a plurality of receivers exist with respect to a single driver, and a net is formed by grouping together the both driver and receivers. FIG. 3C illustrates a net N1 containing the cell CEL 1 as a driver, and the cell CEL 2, a cell CEL 5 and cell CEL 6 as receivers corresponding to the driver.

Figure 3D:
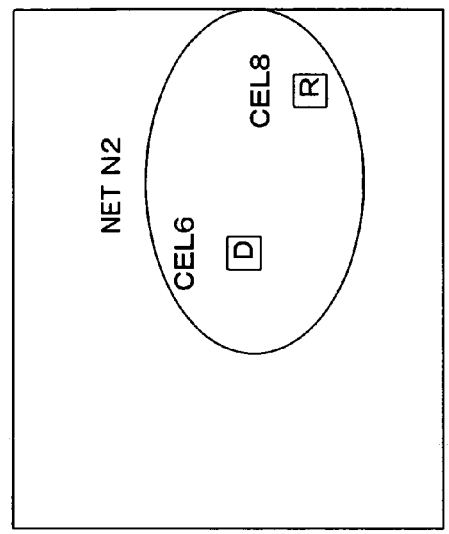
FIG. 3D is a figure showing another example of nets.

FIG. 3D is a figure showing another example of the nets. FIG. 3D illustrates a net N2 containing the cell CEL 6 as a driver, and a cell CEL 8 as a receiver corresponding to the driver. In this another net as above, the cell which was the receiver sometimes turns into a driver. Further, a net may contain one or a plurality of receivers.

The information and drive relationship of the cells 102 described above are expressed by position information which is specified by coordinates located on the X- and Y-axes shown in FIG. 3B, and are stored in the storage portion 13, with a premise of design support described in the present embodiment. Specifically, arranging the cells 102 is supposed to be completed before wiring step.

FIG. 4A is a data configuration example of cell information stored in the storage portion 13. The cell information in FIG. 4A has data items, such as "cell", "input terminal coordinates", and "output terminal coordinates".

The "cell" is an identifier for identifying the cell 102. The "input terminal coordinates" are X- and a Y-coordinates that indicate a position of the input terminal of the cell 102, which relates to the case when the cell 102 becomes a receiver. The "output terminal coordinates" are X- and Y-coordinates that indicate a position of the input terminal of the cell 102, which relates to the case when the cell 102 becomes a driver.

FIG. 4B is a data configuration example of information specifying the drive relationship, the information being stored in the storage portion 13. The drive relationship information in FIG. 4B has data items called "net", "driver", and "receiver".

The "net" is an identifier for identifying a net. The "driver" is an identifier for specifying a cell 102 which becomes a driver contained in the net. The "receiver" is an identifier for specifying a cell 102 which becomes a receiver contained in the net.

FIG. 5A is a figure for explaining diagonal wiring which is commonly used in the description of the embodiment. By using diagonal wiring, the length of the wiring is reduced, compared to the case of using vertical and/or horizontal wiring.

As shown in FIG. 5A, the diagonal wiring to be used in accordance with the positional relationship between he output terminal of a driver D and the input terminal of a receiver R is changed. Given that the position of the output terminal of the driver D is an original point, when the position of the input terminal of the receiver R is in the first quadrant or the third quadrant, first diagonal wiring having an inclination of α degrees (0<α<90) is used. On the other hand, given that the position of the output terminal of the driver D is an original point, when the position of the input terminal of the receiver R is in the second quadrant or the fourth quadrant, second diagonal wiring having an inclination of β degrees (90<β<180) is used.

FIG. 5B is a figure showing the relationship between the first diagonal wiring and the second diagonal wiring. The description hereinafter is provided on the basis of the first wiring; however, as shown in FIG. 5B, the description can be often applied to the second diagonal wiring by substituting the angle α to be used in the explanation to an angle (180-β). Note that when the angle of the diagonal wiring is 0, 90, or 180 degrees, it is only necessary to place vertical and/or horizontal wiring (referred to as "conventional wiring") as is conventionally done, thus the explanation thereof is omitted.

Figure 6A:
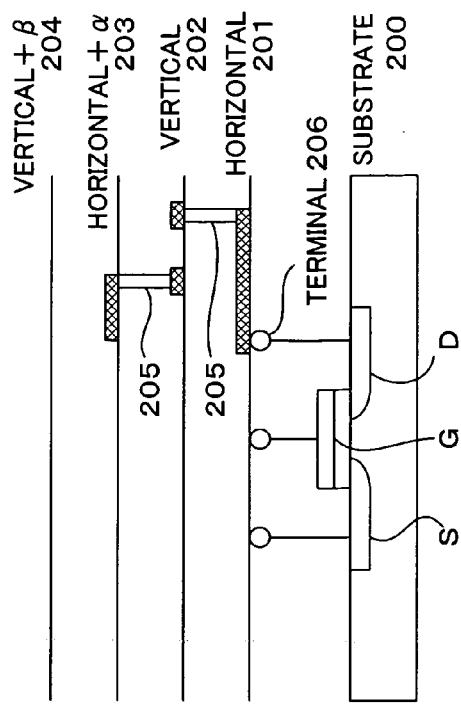
FIG. 6A is a figure showing a structure of wiring layers in a semiconductor integrated circuit 100.

FIG. 6A is a figure showing a layer structure of wiring in the semiconductor integrated circuit 100. As shown in FIG. 6A, the semiconductor integrated circuit 100 has a multi-layered structure where several wiring layers, such as aluminum or the like, are superimposed on top of one another on a substrate 200. For example, horizontal wiring is arranged on a first layer 201, vertical wiring is arranged on a second layer 202, horizontal wiring and the first diagonal wiring are arranged on a third layer 203, and vertical wiring and the second diagonal wiring are arranged on a fourth layer 204.

By taking multilevel wiring in which vertical wiring layers and horizontal wiring layers are present alternately, complicated wiring can be arranged in a narrow region. Furthermore, by allowing the vertical or horizontal wiring to coexist on the layer where diagonal wiring is arranged, the wiring layers can be efficiently used.

Figure 6B:
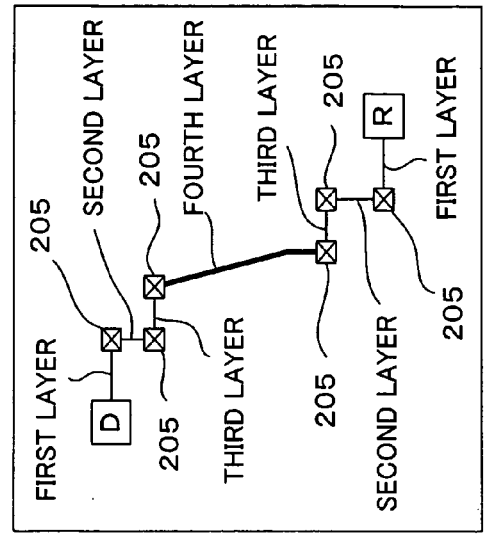
FIG. 6B is a cross-sectional drawing of the semiconductor integrated circuit.

FIG. 6B is a cross-sectional drawing of the semiconductor integrated circuit 100. In FIG. 6B there is illustrated a condition where terminals 206 of P-channel type semiconductor contacting a first layer 201, which is the bottom layer, are connected to a wire of an upper wiring layer. Each of the wiring layers is connected with each other by means of a connection member, called "via" 205.

Figure 6C:
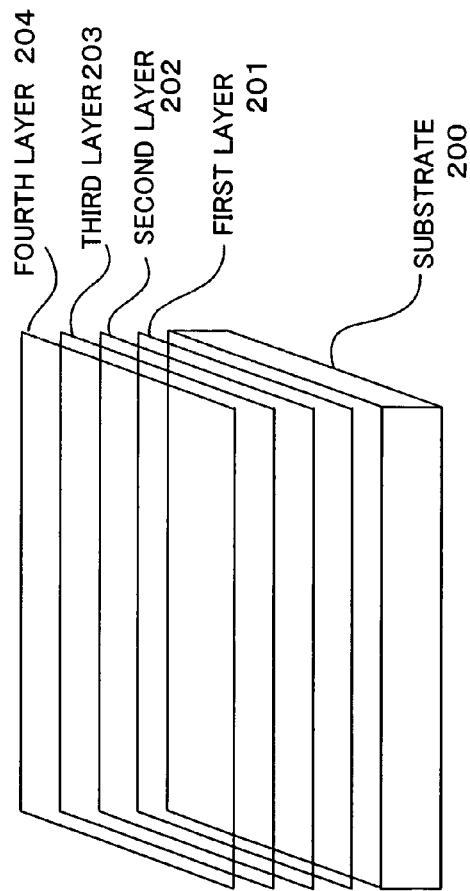
FIG. 6C is a figure for explaining the relationship between the wiring layers and wiring performed when the first diagonal wiring is used.

FIG. 6C is a figure for explaining the relationship between the wiring layers and the wiring performed using the first diagonal wiring. The first diagonal wiring is arranged on a third layer 203. As described above using FIG. 6A, on the third layer, horizontal wiring can be also arranged thereon, thus horizontal wiring that extends to the via 205 is connected with the first diagonal wiring in association with the position of the via 205. Further, in the remaining section vertical wiring and horizontal wiring are arranged from the third layer towards the first layer to which a terminal of a cell is connected, via the second layer. A layer is descended by going through the via 205.

Figure 6D:
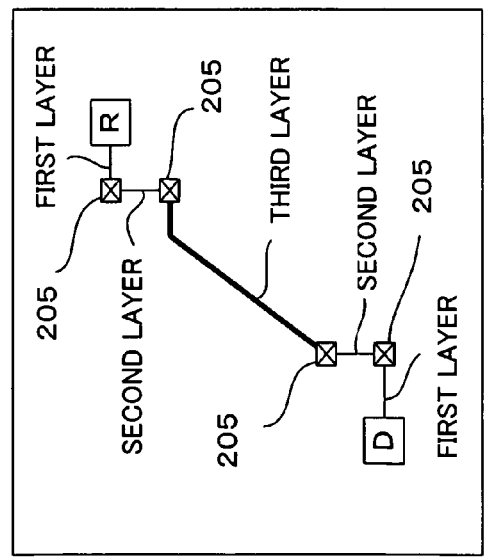
FIG. 6D is a figure for explaining the relationship between the wiring layers and wiring performed when the second diagonal wiring is used.

FIG. 6D is a figure for explaining the relationship between the wiring layers and the wiring performed using the second diagonal wiring. The second diagonal wiring is arranged on a fourth layer 204. As described above using FIG. 6A, on the fourth layer, vertical wiring can be also arranged thereon, thus vertical wiring that extends to the via 205 is connected with the second diagonal wiring in association with the position of the via 205. Further, in the remaining section vertical wiring and horizontal wiring are arranged from the fourth layer towards the first layer to which a terminal of a cell is connected, via the third layer and second layer. A layer is descended by going through the via 205.

Next, a first embodiment is explained. In the first embodiment, the position for arranging diagonal wiring in designing the above-described semiconductor integrated circuit is to be optimized in accordance with the positional relationship between the driver and receiver.

Figure 7:
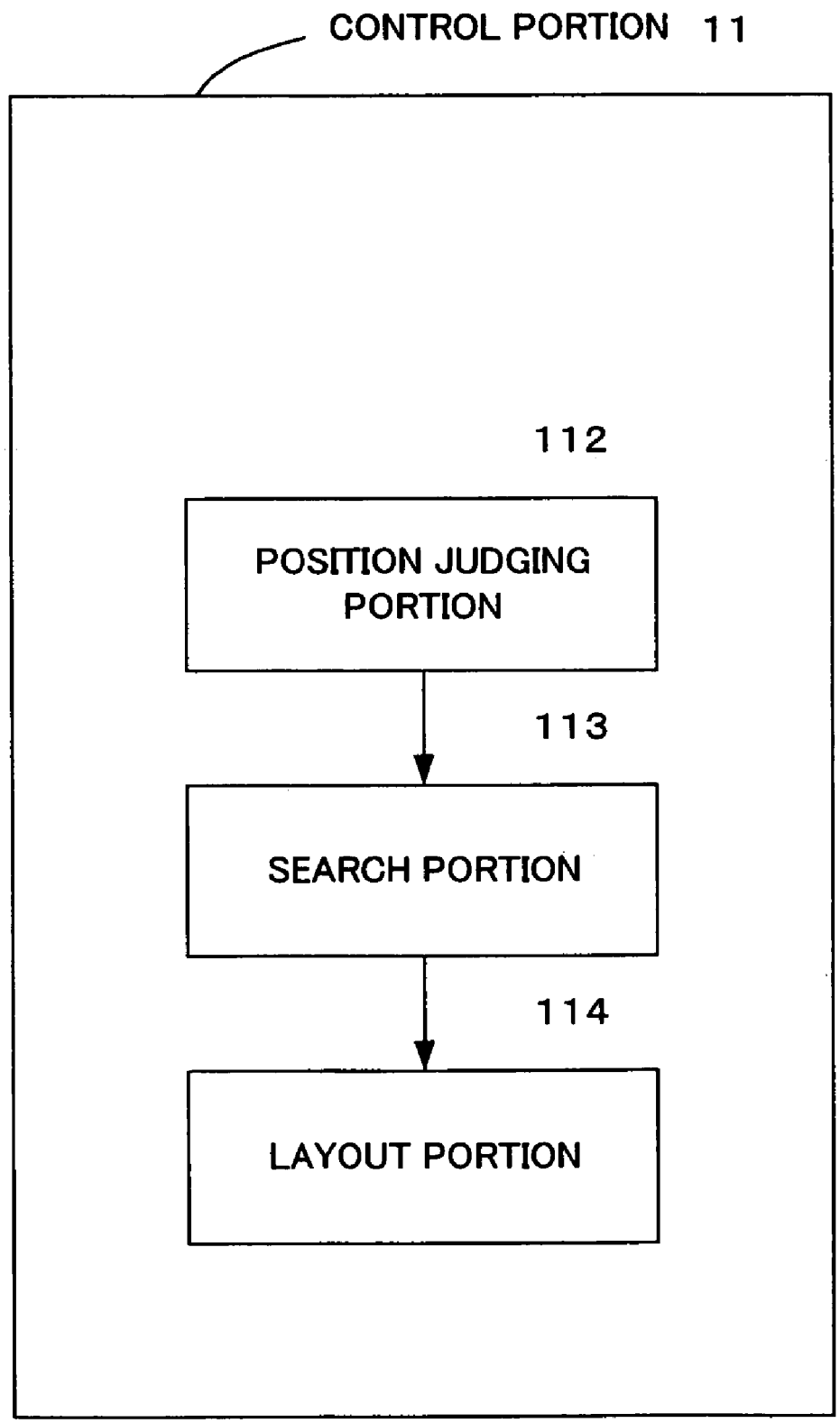
FIG. 7 is a functional block diagram for explaining a control portion of the design support apparatus in a first embodiment.

FIG. 7 is a functional block diagram for explaining the control portion 11 of the design support apparatus 1 in the first embodiment. The control portion 11 has a position judging portion 112, a search portion 113, and a layout portion 114. Each of the functional portions in the control portion 11 is implemented as a program executed by an unshown CPU, which is equipped in the control portion 11, and also may be implemented by hardware.

The position judging portion 112 determines, for each net, whether diagonal wiring should be used or not in the net on the basis of the positional relationship between the driver and receiver. In particular, if there are a plurality of receivers contained in the net, there may be no reason to use diagonal wiring, or the wiring may get complicated even more. The position judging portion 112 eliminates these problems.

The search portion 113 searches for a region where diagonal wiring can be arranged, for each net in which the position judging portion 112 has judged that the diagonal wiring is used. The search portion 113 searches for the existence of a place with obstruction in which a signal wire (including normal wiring) cannot be arranged, as well as a used place in which wiring is already used, when sliding the diagonal wiring to a predetermined direction in a wiring layer where the diagonal wiring is arranged. If such places do exist, the search portion 113 eliminates them from the region where diagonal wiring can be arranged.

The layout portion 114 temporarily arranges diagonal wiring in the region where diagonal wiring can be arranged, and uses the temporarily arranged diagonal wiring to determine whether or not it is possible to make connection between the driver and receiver. In a conventional technology, a solution for making connection between two points by means of the conventional wiring has been proposed. This conventional solution can be used in a section other than the diagonal wiring, among the paths for connecting the driver and receiver. Even if the layout portion 114 changes the position of the diagonal wiring which is temporarily arranged, unless the layout portion 114 can find diagonal wiring that enables connection between the driver and receiver, the layout portion 114 stops using the diagonal wiring and switches to the conventional wiring to connect the driver and receiver.

Figure 8:
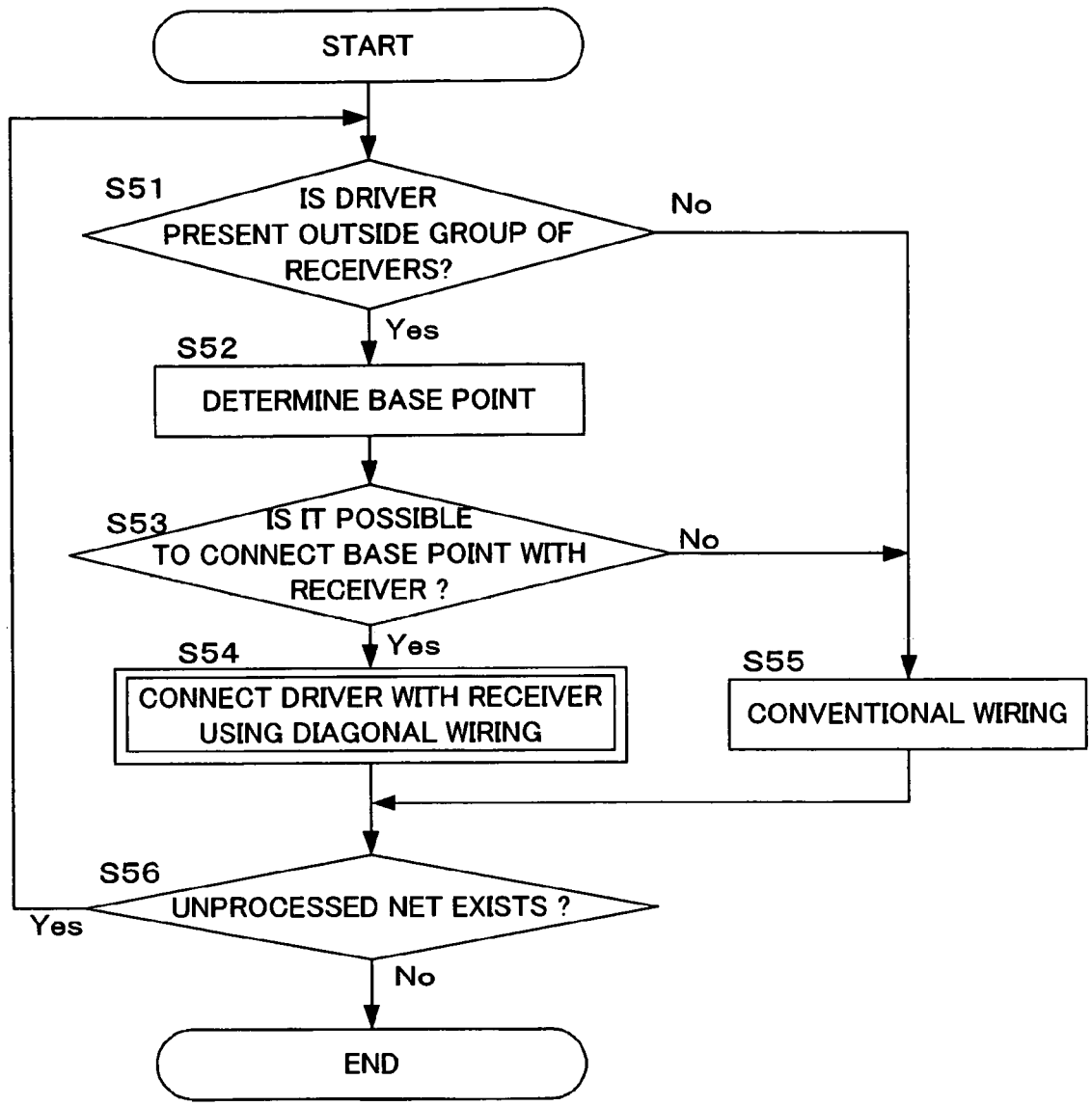
FIG. 8 is a flow chart for explaining an operation of the design support apparatus in the first embodiment.

FIG. 8 is a flow chart for explaining an operation of the design support apparatus 1 in the first embodiment. First of all, the position judging portion 112 determined, for each net, whether to use diagonal wiring in the net or not, based on whether a driver contained in the net exists outside a group of receivers (S51). The "group of receivers" means the entire receivers contained in the net. The processing of the step S51 is called "position judgment".

The position judging portion 112 obtains, as a way of position judgment, a predetermined region (rectangle, circle, ellipse, or the like) which encloses a plurality of receivers, and judges whether a driver is present outside the predetermined region. The position judging portion 112 refers to the cell information (FIG. 4A) stored in the storage portion 13, acquires coordinates of the output terminal of the driver and coordinates of the input terminal of the receiver, and performs the position judgment.

FIG. 9 is a set of figures for explaining an example of the position judgment, where FIG. 9A shows a case in which a rectangle is used as the predetermined region, and FIG. 9B shows a case where an ellipse is used as the predetermined region. FIG. 9A illustrates a net containing a driver D and three receivers R. In the upper image of FIG. 9A, the smallest rectangle 21 that encloses three receivers R is used as the predetermined region, and the driver D is positioned inside the rectangle 21.

When the driver D is positioned inside the rectangle, diagonal wiring should not be arranged in the net. It is because, when the driver D is positioned inside the rectangle, the distance between the driver D and the receiver R is often short. Even when diagonal wiring is used with respect to the cells between which the distance is short, an advantageous effect of using diagonal wiring cannot be expected, thus there is no reason to use diagonal wiring.

Further, even if the distance between the driver D and the receiver R is long enough that there is a point in using diagonal wiring, there is caused a need to use two different diagonal wiring with respect to a single net, because the driver D is positioned inside the rectangle. The fact that the driver D is positioned inside the rectangle means that the receivers are likely to be arranged above, below, and on the left or right side of the driver D. Therefore, with reference to FIG. 5A, chances are high that two different diagonal wiring are necessary in accordance with the quadrants.

In the lower image of FIG. 9A, a driver D is positioned outside the smallest rectangle 22 that encloses three receivers R. In this case, diagonal wiring should be arranged in the net. This is because such a problem as generated in the upper image of FIG. 9A is not caused here. Note that the first diagonal wiring (see FIG. 5B) can be applied with respect to this net, thus the second diagonal wiring seems unnecessary.

Of the coordinates of the input terminal of the receivers R, it is given that the minimum x-coordinate is x1, the minimum y-coordinate is y1, the maximum x-coordinate is x2, and the maximum y-coordinate is y2. Thereby a shape with four points (x1, y1), (x1, y2), (x2, y1), and (x2, y2) can be obtained to specify the rectangle 22. Moreover, since the coordinates of the output terminal of the driver are already known, it is easy to check whether or not the driver is present outside the rectangle.

Note that the predetermined region may be a rectangle that encloses the receivers R. In this case, a rectangle whose area is a predetermined threshold or less is selected, so as to prevent the predetermined region from unnecessarily becoming wide.

In the upper image of FIG. 9B, an ellipse 23 that encloses three receivers R is used as the predetermined region, where the driver D is positioned inside the ellipse 23. In this case as well, diagonal wiring should not be arranged for the same reason as in the upper image of FIG. 9A.

In the lower image of FIG. 9B, a driver D is positioned outside an ellipse 24 that encloses three receivers R. In this case as well, diagonal wiring should be arranged in the net for the same reason as in the lower image of FIG. 9A Note that the first diagonal wiring (see FIG. 5B) can be applied with respect to this net as well, thus the second diagonal wiring seems unnecessary.

The ellipse containing the receivers R therein can be computed on the basis of the coordinates of the input terminal of the receiver. For example, given that a formula of the ellipse is $f(x, y)=x^2/a+y^2/b-c$, a, b and c such that $f(x, y)<0$ is established by assigning x- and y-coordinate values of the input terminal of the receiver R to variables x and y in the formula. As to whether or not the driver D exists outside the ellipse, it is easy to judge that there is the driver D outside the ellipse, when $f(x, y)>0$ is established by assigning the x- and y-coordinate values of the output terminal of the driver D.

At this point, an ellipse whose area is a predetermined threshold or less is selected, so as to prevent the predetermined region from unnecessarily becoming wide. "Unnecessarily" means a degree that the driver D is contained in the predetermined region.

The predetermined region is not limited to the rectangle or ellipse shown in FIG. 9, and any shape that can contain the receivers R therein may be used. In this case, any shape whose area is a predetermined threshold or less is selected, so as to prevent the predetermined region from unnecessarily becoming wide.

Referring to FIG. 8 again, once the position judgment of the step S51 is completed, the layout portion 114 determines any optional point as a base point, from the predetermined region which was used in the position judgment, and stores the coordinates of the base point in the storage portion 13 (S52) for every net where it is judged that diagonal wiring should be arranged. It is only necessary that a condition is satisfied in which the base point exists in the predetermined region. Further, if there is one receiver contained in the net, the position of the input terminal of this receiver may be set as a base point.

FIG. 10 is a figure partially showing a method for determining the base point. FIG. 10A is for obtaining a tree that passes the driver D and receiver R at least once, on the basis of a graph algorithm, and setting a position around a boundary between a driver D and a group of receivers as the base point. In FIG. 10A, therefore, it is determined that the position of the input terminal of a cell CEL 5 is the base point.

Figure 10B:
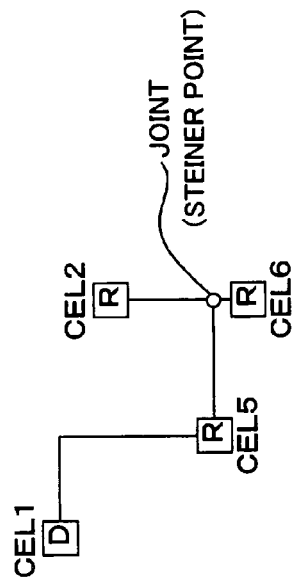
FIGS. 10A-10D are figures partially showing a method for determining a base point.
Figure 10A:
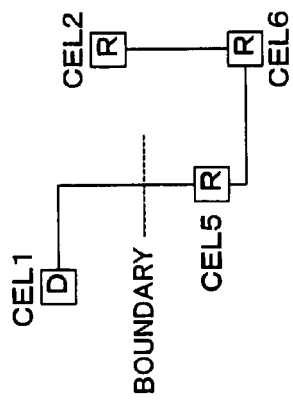

In FIG. 10B, a joint generated as a result of creating the tree on the basis of the graph algorithm, as the base point. The FIG. 10B illustrates a joint (Steiner point) of the Steiner tree, and this joint is determined as the base point. FIG. 10C is for obtaining a center of gravity of the shape in which three receivers R are connected, as a center of the group of receivers, so as to set the center of the group of receivers as the base point. A center of gravity of a polygon can be obtained by dividing a total of the position vectors of the vertexes of the polygon by the number of vertexes.

Figure 10D:
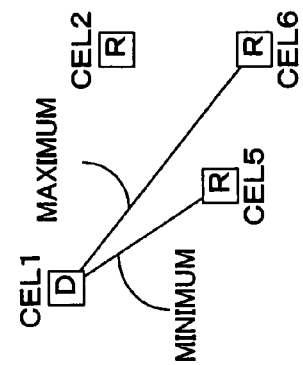
Figure 10C:
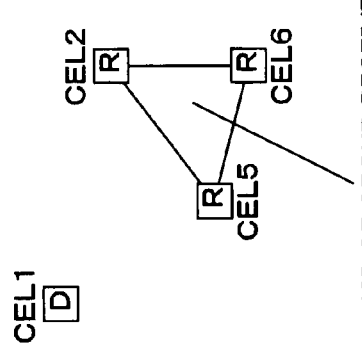

In FIG. 10D, the positions of the input terminals of the receivers R, where the distances from the driver D to the receivers R are maximum or minimum, are the base points. The base point may be selected by means of a method other than the abovementioned method. The base points illustrated in FIG. 10 are merely an example.

Referring to FIG. 8 again, the layout portion 114 then judges, for each net where it is judged that diagonal wiring should be arranged, whether or not the base point and receiver can be connected by means of the conventional wiring (S53). The layout portion 114 does not prepare for diagonal wiring for each receiver contained in the net, but shares a single diagonal wiring in the net and connects the driver with the receiver. Therefore, it is required that the wiring including the diagonal wiring for connecting the driver with the base point be obtained as a main line, and that the base point, which is the end point of the main line, be able to connect with the receiver.

The processing of the step S53 is for making connection between two points by means of the conventional wiring. This solution is proposed in a conventional technology, and the solution of this conventional technology is used in the processing of the step S53. When it is judged that connection can be made (S53, Yes), the layout portion 114 connects the driver with the base point by using diagonal wiring for each net in which it is judged that connection can be made in the step S53 (S54). Processing of arranging diagonal wiring of the step S54 will be described using FIG. 11.

In the step S51, when a driver exists inside a group of receivers (S51, No), when the base point cannot be connected with the receivers by means of the conventional wiring in the step S53 (S53, No), arrangement of diagonal wiring for the net is stopped, and the step is switched to processing of making connection between the driver and receiver by means of the conventional wiring (S55).

Once completing the step S54 or S55, it is judged whether or not there is an unprocessed net (S56). If there is an unprocessed net (S56, Yes), the processing is performed starting from the step S51 again, and if there is no unprocessed net (S56, No), the processing is ended.

Figure 11:
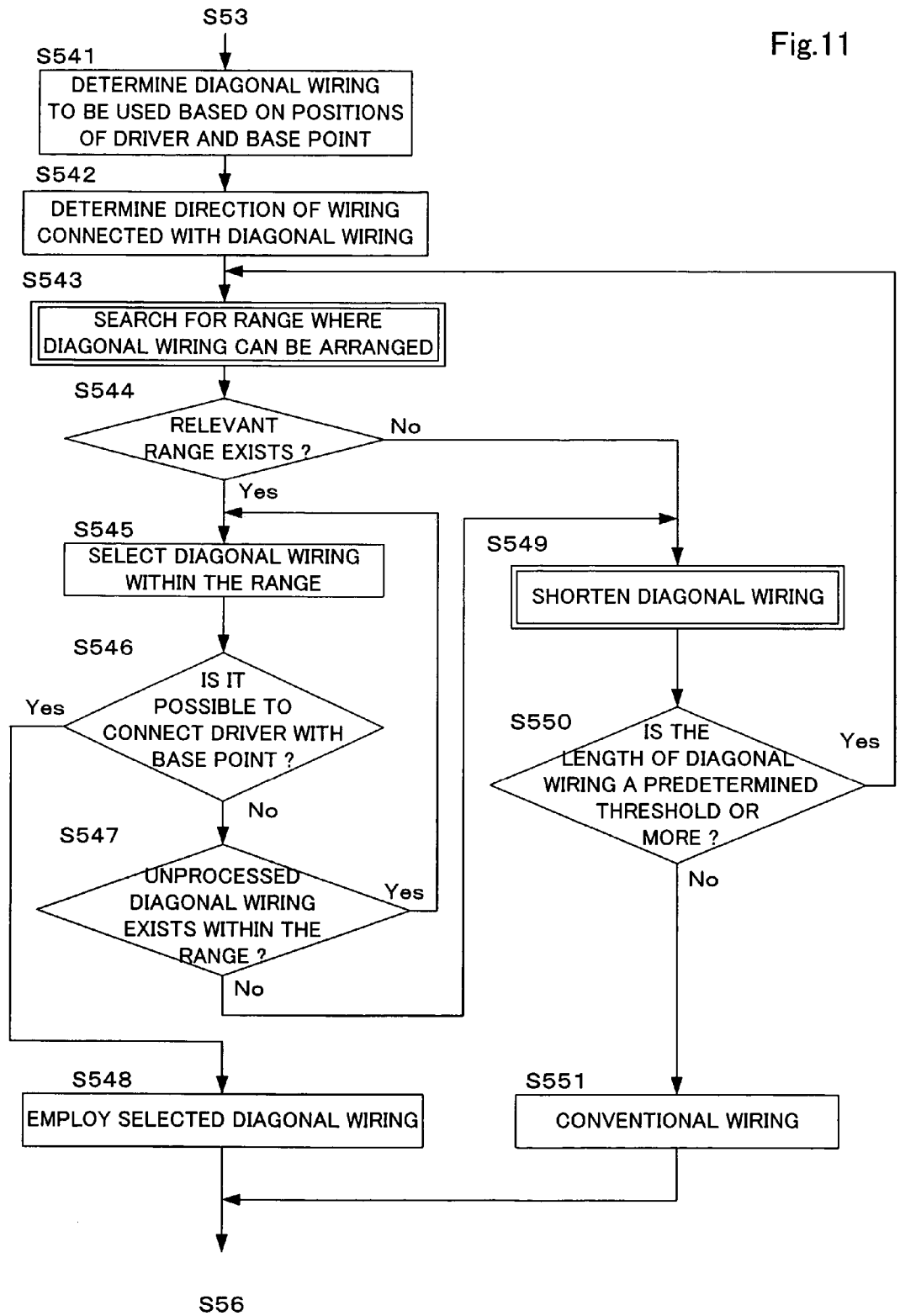
FIG. 11 is a flow chart for explaining processing for arranging diagonal wiring.

FIG. 11 is a flow chart for explaining the processing for arranging the diagonal wiring of the step S54. First of all, based on the positions of the driver and base point, the search portion 113 decides which one of the first diagonal wiring or second diagonal wiring to use, for each net where it is judged in the step S53 that connection can be made (S541).

In this case, when replacing the receivers in FIG. 5A by the base points, it is decided that the first diagonal wiring is used in the case where the driver and the base point are in the first quadrant or third quadrant, and that the second wiring is used in the case where they are in the second quadrant or third quadrant. The search portion 113 then decides a direction of wiring adjacent to the diagonal wiring (S542).

FIG. 12 is a figure for explaining a condition where a direction of wiring adjacent to the diagonal wiring is determined. FIG. 12 explains assuming that each driver D and each base point B are in the first quadrant shown in FIG. 5A. Each thick line is the wiring where diagonal wiring is used.

Figure 12B:
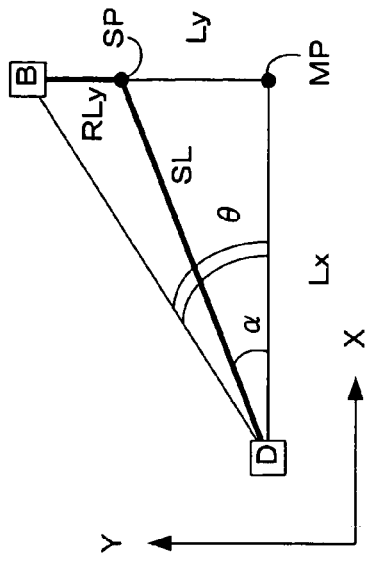
FIGS. 12A-12D are figures for explaining a condition in which a direction of wiring adjacent to diagonal wiring is determined.
Figure 12D:
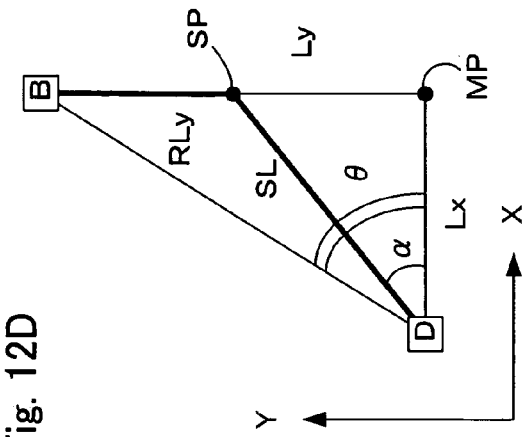
Figure 12A:
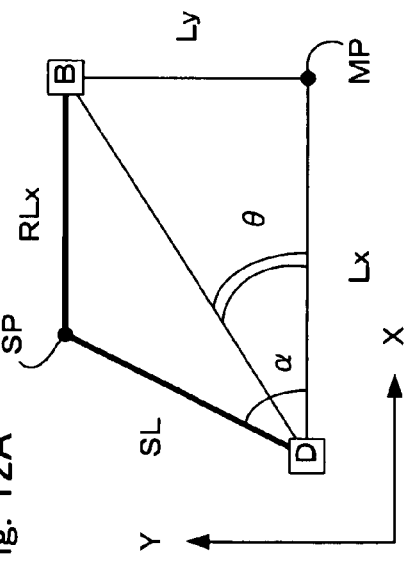

FIG. 12A shows a case where a α-degree inclination of the first diagonal wiring is at least a θ-degree inclination of a line segment which connects the driver D with the base point B, where θ is 45 degrees or less. In this case, as shown in FIG. 12A, the direction of wiring adjacent to the first diagonal wiring is in a horizontal direction.

FIG. 12B shows a case where a α-degree inclination of the first diagonal wiring is less than a θ-degree inclination of a line segment which connects the driver D with the base point B, where θ is 45 degrees or less. In this case, as shown in FIG. 12B, the direction of wiring adjacent to the first diagonal wiring is in a vertical direction.

Figure 12C:
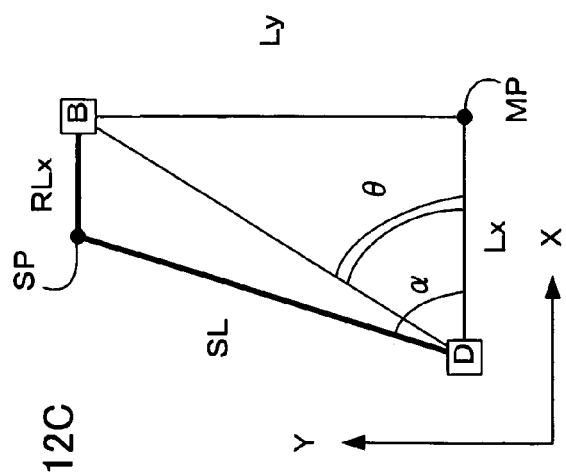

FIG. 12C shows a case where a α-degree inclination of the first diagonal wiring is at least a θ-degree inclination of a line segment which connects the driver D with the base point B, where θ is at least 45 degrees. In this case, as shown in FIG. 12C, the direction of wiring adjacent to the first diagonal wiring is in a horizontal direction.

FIG. 12D shows a case where a α-degree inclination of the first diagonal wiring is less than a θ-degree inclination of a line segment which connects the driver D with the base point B, where θ is at least 45 degrees. In this case, as shown in FIG. 12D, the direction of wiring adjacent to the first diagonal wiring is in a vertical direction.

In the step S542, the search portion 113 calculates the θ-degree inclination of a line segment which connects the driver D with the base point B, based on the coordinates of the output terminal of the driver D and the coordinates of the base point B. The tangent θ can be obtained readily with the two coordinates, whereby the inclination θ of the line segment can be calculated.

Referring to FIG. 11 again, after the step S542, the search portion 113 searches for a range where diagonal wiring can be arranged (S543). The search portion 113 slides the diagonal wiring to the direction of the wiring adjacent to the diagonal wiring, the direction being determined in the step S542, so as to search for the existence of a place with obstruction in which a signal wire (including normal wiring) cannot be arranged, as well as a used place in which wiring is already used. If such places do exist, the search portion 113 eliminates them from the region where diagonal wiring can be arranged.

Figure 13B:
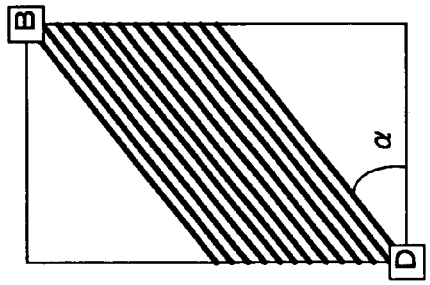
FIGS. 13A-13C are figures for explaining a condition in which a search is performed.
Figure 13A:
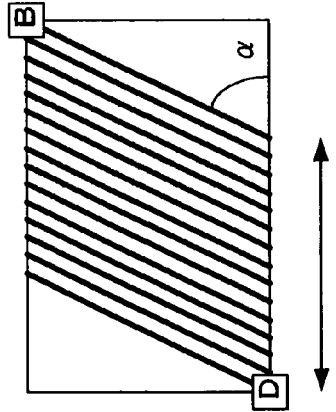
Figure 13C:
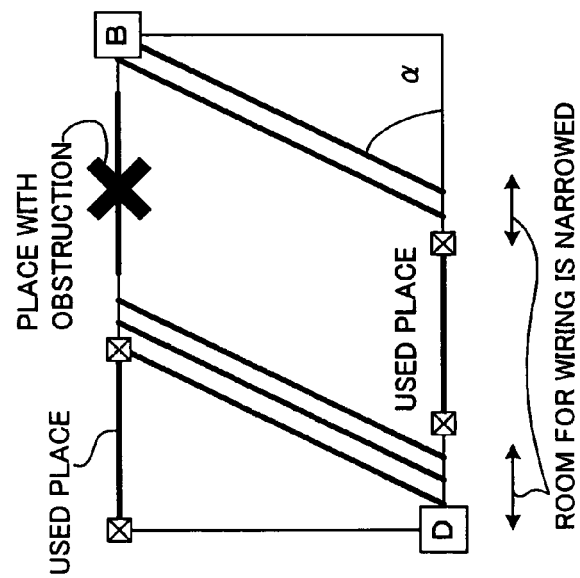

FIG. 13 is a figure for explaining a condition in which a search is performed. FIG. 13A shows a case where a search is carried out in a horizontal direction, and FIG. 13B shows a case where a search is carried out in a vertical direction. There is no place with obstruction or a used place in FIG. 13A and FIG. 13B, thus diagonal wiring can be arranged in a wide range. FIG. 13C shows a case where the region where wiring arrangement is possible is narrowed, due to the existence of the place with obstruction and the used place.

FIG. 14 is a data configuration example of a table which has stored therein the position information on the place with obstruction and the used place on the basis of wiring layer. The table of FIG. 14 has data items, such as "layer", "type", and "position". "Layer" is an identifier for identifying the wiring layer. "Type" indicates the information indicating the used place or the information indicating the place with obstruction. "Position" is coordinate information for specifying each place.

Referring to FIG. 11 again, in the step S543, the search portion 113 uses a line segment of $y=(\tan \alpha) x+b$, where $y1 \leq y \leq y2$, refers to the table in FIG. 14, and checks to see if this straight line overlaps with the place with obstruction or with the used place in a wiring layer where the diagonal wiring determined in the step S541 is arranged. Here, y1 is the smaller value among the values of y-coordinate of the output of the driver and y-coordinate of the base point, while y2 is the larger value among the values of y-coordinate of the output terminal of the driver and y-coordinate of the base point.

Moreover, the search portion 113 changes a y-intercept b and stores in the storage portion 13 the y-intercept b which has been confirmed that the straight line does not overlap with the place with obstruction or used place. By this the search portion 13 searches for ranges in which the diagonal wiring can be arranged. Once completing the search of the step S543, it is judged in the step S543 whether the ranges in which the diagonal wiring can be arranged are found or not (S544).

In the search, if the ranges where the diagonal wiring can be arranged is found, in other words, if the information on the y-intercept b is stored in the storage portion 13 (S544, Yes), the layout portion 114 selects a range where the diagonal wiring can be arranged (S545). In the step S545, it is only necessary for the layout portion 114 to select one y-intercept b stored in the storage portion 13.

At this time, in the range of the upper limit and the lower limit of the y-intercept b, the layout portion 114 may select a y-intercept b, starting from the values approximately in the middle, and search towards the lower limit or the upper limit. For example, if the y-intercept b is in a range from 0 to approximately 100, processing may be started by taking the b as 50. This intends to use more extensively the region of wiring for a wiring layer by arranging a diagonal wiring around the middle of a range where diagonal wiring can be arranged.

Next, the layout portion 114 judges whether or not it is possible to use the conventional wiring to connect both the driver and base point with the end points of selected diagonal wiring, when using the selected diagonal wiring (S546). This step is to judge whether or not it is possible to connect the driver side end point of the diagonal wiring with the driver or to connect the base point side end point of the diagonal wiring with the base point. The processing of the step S546 is the same as the step S53 and is to make connection between two points by means of the conventional wiring. This solution had been proposed in a conventional technology, and the solution of the conventional technology is used.

Once judged in the step S546 that connection can be made (S546, Yes), the layout portion 114 actually arranges the selected diagonal wiring in the step S545, and, for the section other than the diagonal wiring where the driver is connected with the base point, the conventional wiring used in the step S546 is used to make connection (S548), whereby the processing of arranging the diagonal wiring is completed.

Once judged in the step S546 that connection cannot be made (S546, No), the layout portion 114 judges whether or not there is an unprocessed diagonal wiring in the range where diagonal wiring can be arranged (S547). The layout portion 114 checks to see if there are any y-intercepts b in the storage portion 13 that have not yet been tried, and, if stored (S547, Yes), the step returns to the step S545 to carry out the processing for new diagonal wiring.

In the search, when the ranges where the diagonal wiring can be arranged is found (S544, No), and when no appropriate diagonal wiring was found in the range obtained as a result of the search in the step S543 (S547, No), the length of the diagonal wiring is shortened, and the search is carried out again (S549). However, if the length of the diagonal wiring is shortened too much, there is no merit in arranging the diagonal wiring. Therefore, when the length of the diagonal wiring after shortening it is at least a predetermined threshold (S550, Yes), the step returns to the step S543 to carry out the search again.

If the length of the diagonal wiring after shortening it is below the predetermined threshold (S550, No), arranging the diagonal wiring in the net is stopped, and the processing is switched to the processing of making connection between the driver and receivers by means of the respective conventional wiring (S551), whereby the processing of arranging the diagonal wiring is completed.

FIG. 15 is a figure for explaining a condition when the diagonal wiring is shortened to perform a search again. FIG. 15A shows a state in which there is no place for laying diagonal wiring, and corresponds to the state of the step S544 (No) in FIG. 11. FIG. 15B shows a state where the conventional wiring cannot be arranged with respect to the driver and base point from the end points of the diagonal wiring, and corresponds to the state of the step S547 (No) in FIG. 11.

Figure 15F:
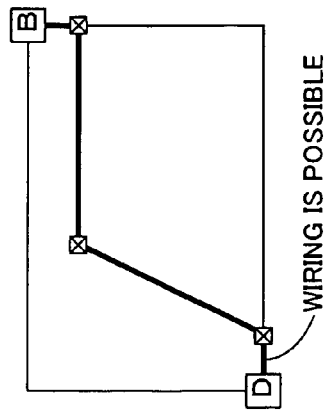
FIGS. 15A-15F are figures for explaining a condition when diagonal wiring is shortened to perform a search again.
Figure 15C:
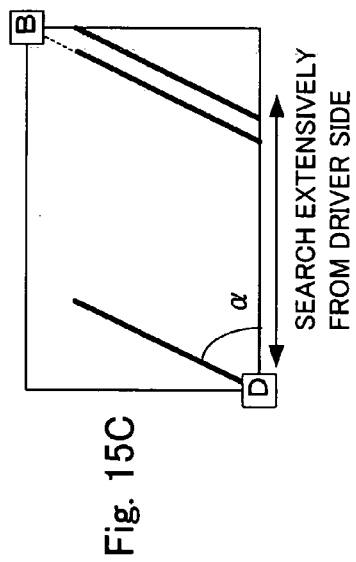
Figure 15D:
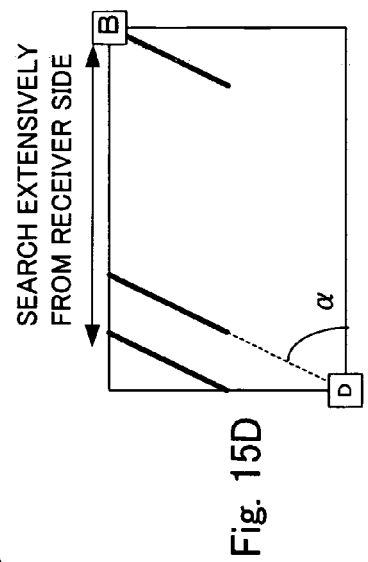
Figure 15E:
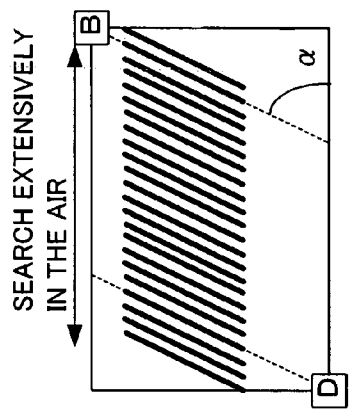
Figure 15A:
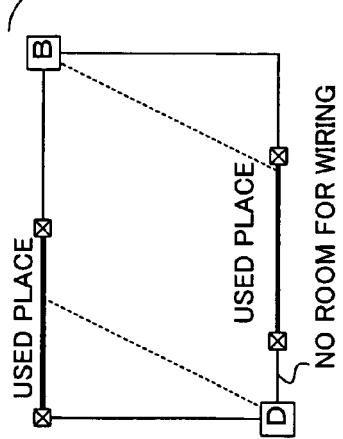
Figure 15B:
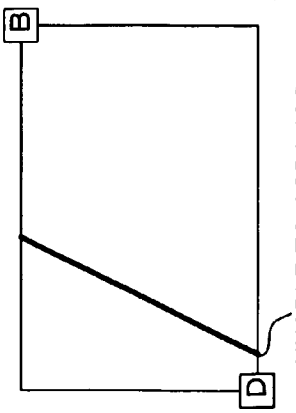

FIG. 15C is a figure explaining a state in which the shortened diagonal wiring is approached to the driver side to carry out the search again. FIG. 15D is a figure explaining a state in which the shortened diagonal wiring is approached to the base point side (receiver side) to carry out the search again. FIG. 15E is a figure explaining a state in which the shortened diagonal wiring is positioned midway between the driver side and the base point side to carry out the search again. As above, a method for carrying the search again may be selected freely. First, the search is carried out with the method of FIG. 15C, and, if the search still needs to be carried out again, the method of FIG. 15D is used to carry out the search, and the method of FIG. 15E may be used lastly to carry out the search again.

According to the first embodiment described above, diagonal wiring is arranged for connecting a driver with receivers in a net where the driver is positioned outside the group of receivers, thus a plurality of types of diagonal wiring do not have to be used in a single net, whereby efficient wiring is possible. This is contributed by the fact that the diagonal wiring to be used in a single net is arranged in one direction.

Furthermore, for the wiring of the driver and the base point determined in a predetermined region for enclosing the group of receivers, diagonal wiring as a main line, which can be commonly used for connecting the receivers contained in the net, is arranged, whereby it is possible to save the effort of arranging diagonal wiring for each receiver. Consequently, the wiring process is sped up, and the advantageous effect obtained by the reduced wiring process can be shared, thereby improving the wiring. Moreover, the diagonal wiring is performed from around the middle of a range where diagonal wiring can be arranged in each wiring layer by carrying the search, whereby the region can be utilized effectively. Also, since the shortest length of the part where diagonal wiring is arranged is determined, inefficient arrangement of the diagonal wiring is prevented.

In the first embodiment, the search portion searches for ranges where diagonal wiring can be arranged, and diagonal wiring is arranged in a position selected within the ranges; however, there are other methods for connecting the driver with the base point by using diagonal wiring after the base point is determined. For example, the layout portion 114 arranges diagonal wiring with the predetermined length (without searching), whose end point is the driver or base point, and the conventional wiring may be arranged in the rest of the section. When using this diagonal wiring with the predetermined length, if the driver and receiver cannot be connected with each other, the layout portion may switch to the conventional wiring to perform the processing, or the predetermined length of the diagonal wiring can be reduced, and thus obtained diagonal wiring can be arranged. As above, by directly arranging the diagonal wiring without sliding it, with the driver or base point as the end point of the diagonal wiring, the design support apparatus of the first embodiment can also have a configuration which is not provided with the search portion for searching ranges where diagonal wiring can be set.

A second embodiment will now be described. In the first embodiment, it often takes time to carry out the position judgment for all the nets, since the nets for arranging diagonal wiring are not discriminated in particular. In the second embodiment, therefore, first of all the nets in which the diagonal wiring should be arranged are narrowed down, whereby the processing is sped up by performing the position judgment on discriminated nets.

Figure 16:
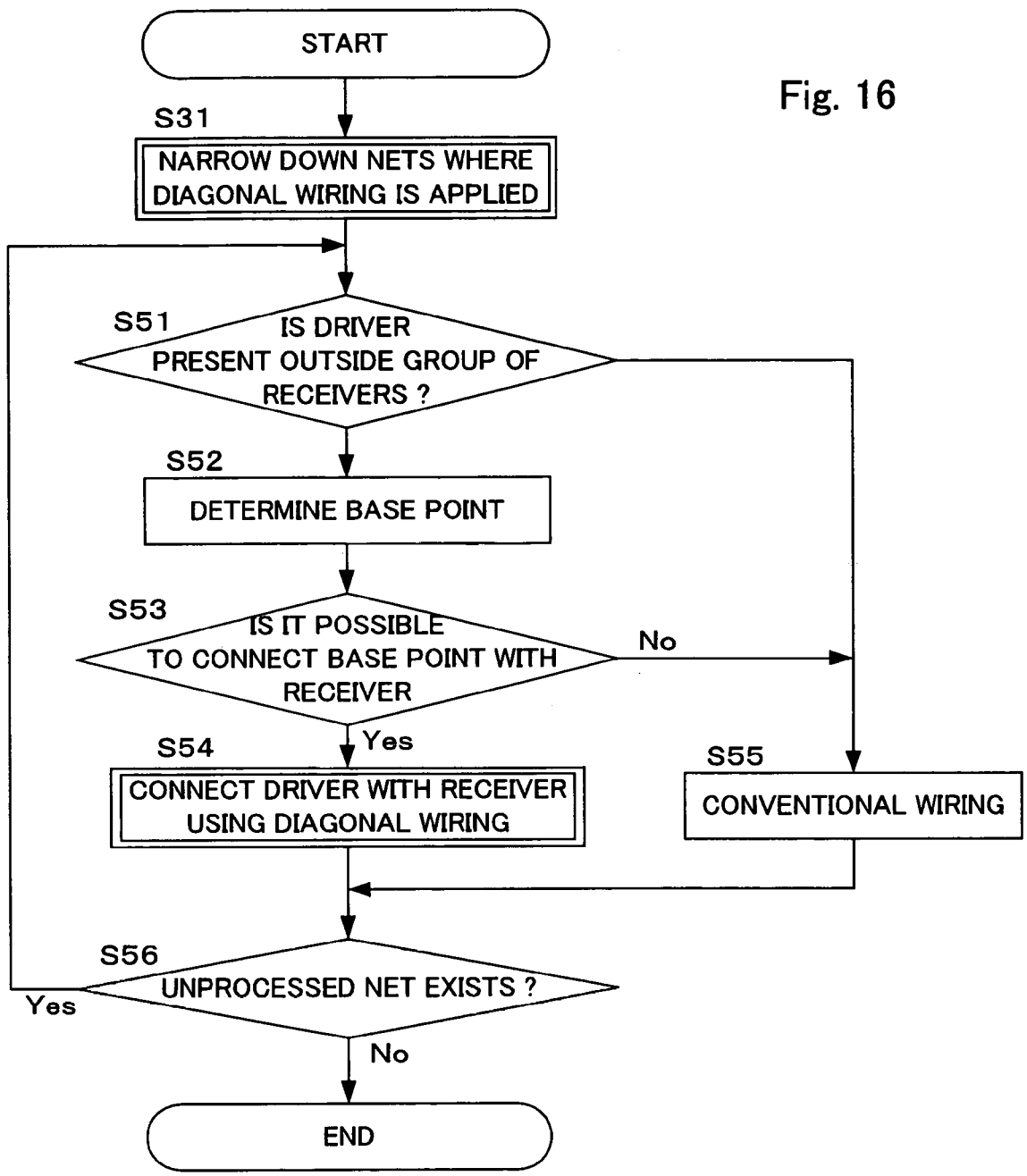
FIG. 16 is a flow chart for explaining an operation of the design support apparatus in a second embodiment.

FIG. 16 is a flow chart for explaining an operation of the design support apparatus 1 in the second embodiment. The difference from the first embodiment is that a step for narrowing down the nets for performing the position judgment is provided before the step S51. The rest is same as the operation flow (FIG. 8) in the first embodiment, thus the explanation thereof is omitted.

First of all, the position judging portion 112 narrows down the nets where diagonal wiring is applied (S31). Once completing the step S31, the position judging portion 112 performs position judgment on the nets narrowed down in the step S31 (S51). The processing thereafter is same as that of the first embodiment (FIG. 8), thus the explanation thereof is omitted.

Figure 17:
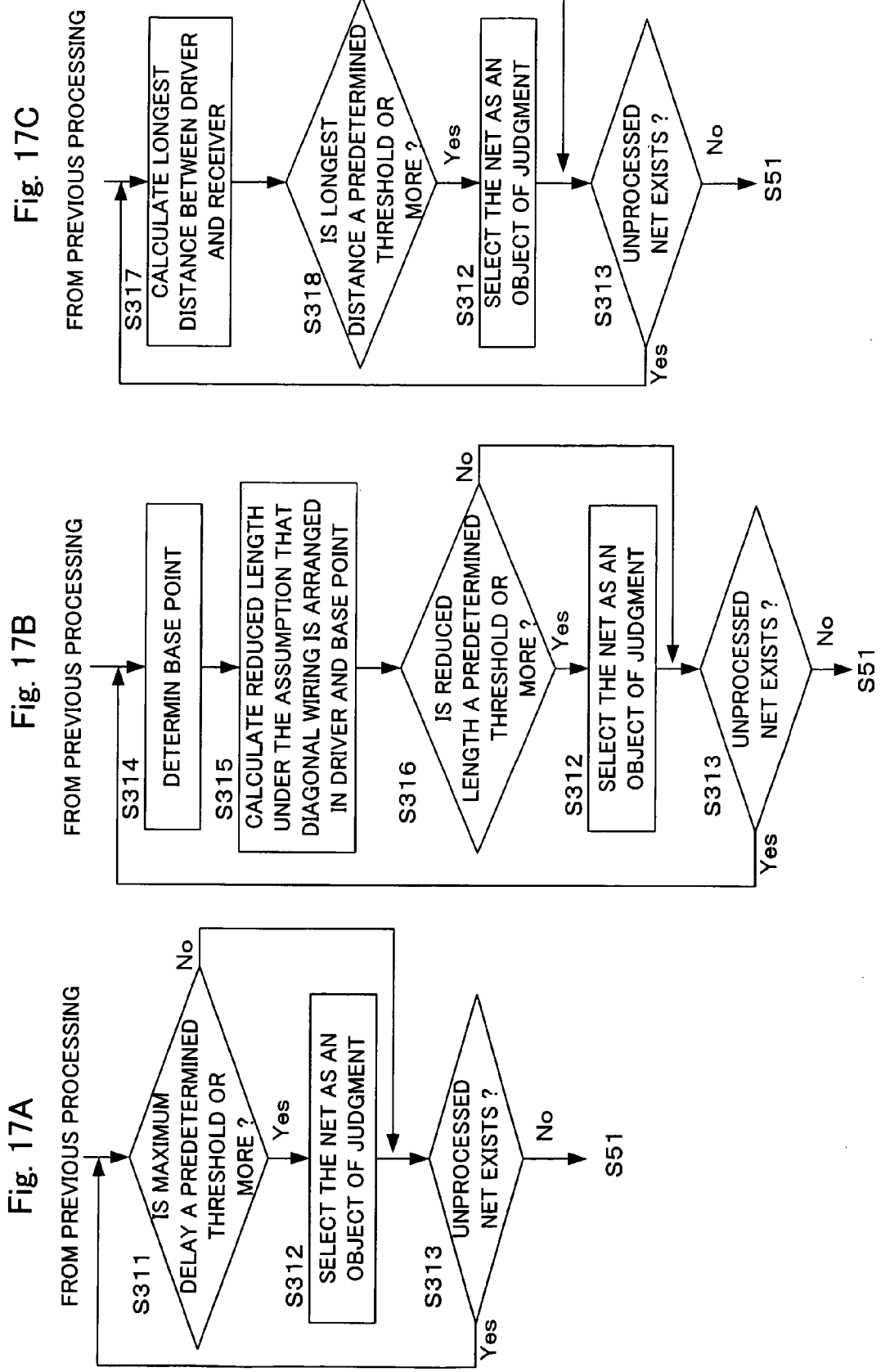
FIGS. 17A-17C are flow charts for explaining an example of narrowing-down processing for narrowing down the nets to which diagonal wiring is applied.

FIG. 17 is a flow chart for explaining an example of the narrowing-down processing of the step S31 in FIG. 16 where the nets to which diagonal wiring is applied are narrowed down. In the narrowing-down processing, advantageous effects of arranging diagonal wiring and the dimension of a net are calculated. Then, based on calculated numeric values, narrowing down the nets is performed so as to arrange diagonal wiring on the net with a large dimension or the net which is predicted to have the advantageous effect of arranging diagonal wiring.

FIG. 17A is for narrowing down the nets that perform the position judgment on the basis of delay time of each net. When the processing of FIG. 17A is carried out, it is supposed that the delay time of each net is already stored in the storage portion 13.

Figure 18:
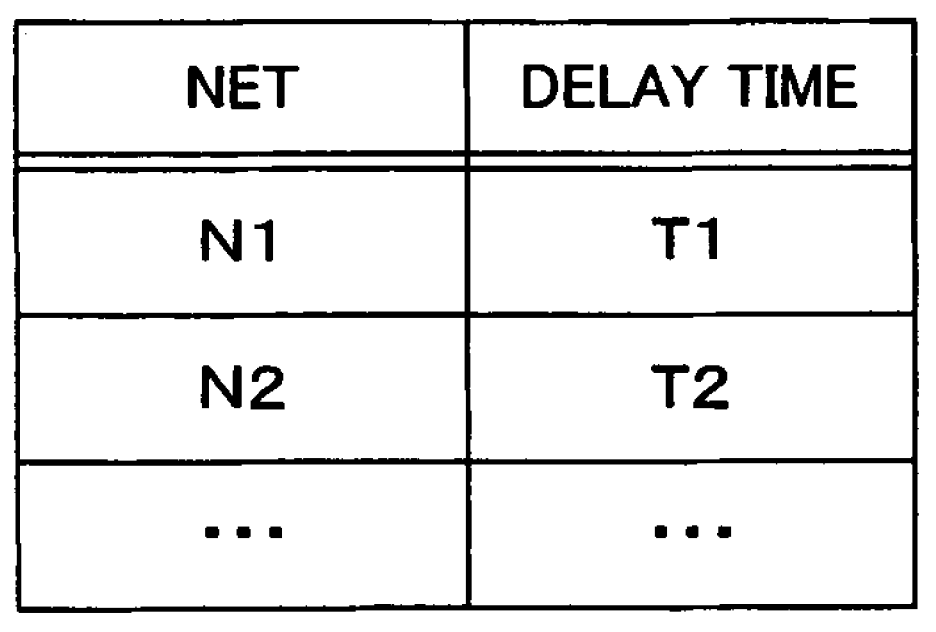

FIG. 18 is a data configuration example of a table of the delay times stored in the storage portion 13. The delay time table in FIG. 18 has data items, such as "net" and "delay time". The "net" is an identifier for identifying a net. The "delay time" shows the maximum delay time among the delay times generated on a path for connecting the driver with each receiver by means of the conventional wiring.

In a state where arrangement of the cells are completed, delay times generated on a path for connecting these cells by means of the conventional wiring are information that can be acquired readily by using a simulation tool or the like in a conventional technology. By referring to this delay time table, the (maximum) delay time of each net can be acquired. Note, in FIG. 18, that although only the maximum delay time in each net is stored, a delay time of each path contained in a net may be stored for each net.

Referring to FIG. 17A again, first of all the position judging portion 112 refers to the table of the delay times stored in the storage portion 13, and acquires the (maximum) delay time of each net. Then, the position judging portion 112 checks whether the acquired delay time is a predetermined threshold or more (S311).

If the delay time exceeds the predetermined threshold, advantageous effects that can reduce the delay time by arranging diagonal wiring in the net are expected. Reduction of the delay time in a net leads to an improvement/increase in the operation speed in the entire semiconductor integrated circuit. Therefore, if the delay time is the predetermined threshold or more (S311, Yes), the position judging portion 112 selects the net as an object of position judgment (S312).

On the other hand, if the delay time is below the predetermined threshold (S311, No), the net is not selected as an object of position judgment. As a result, diagonal wiring is not arranged in the net. Once finishing the step S312, it is judged if there is an unprocessed net (S313), and the position judging portion 112 repeats the processing of the step S311 on the unprocessed net (S313, Yes). If processing all the nets is completed (S313, No), thereafter the step S51 of FIG. 16 is followed, and the processing of the position judgment and processing thereafter are performed on the net selected in the step S312.

FIG. 17B is for narrowing down the nets on which the position judgment is performed, on the basis of the reduced length (the difference in length between the wiring in the case of the conventional wiring and the wiring in the case of arranging diagonal wiring) in the case where diagonal wiring is arranged in each net. First of all, the position judging portion 112 determines a base point (S314).

This processing is same as the processing described in the step S52 of FIG. 8. Specifically, it is only necessary to obtain a predetermine region (rectangle, circle, ellipse, or the like) which encloses the group of receivers, and select any one point from within the predetermined region. FIG. 10 shows an example of the selection method; however, there is no particular limitation in the method for selecting a base point as long as it is in the predetermined region.

The position judging portion 112 then calculates, for each net, the reduced length in the case of connecting the driver with the base point by using diagonal wiring (S315). The method for calculating the reduced length $\Delta L$ is explained using FIG. 12. First, the symbols appearing in FIG. 12 are explained.

In FIG. 12, a turn-round point MP is a turn-round point for measuring Manhattan distance between a driver D and base point B, and three points of the positions of the turn-round point MP, base point B, and the output terminal of the driver D are arranged so as to form a right angled triangle. Further, the distance between the turn-round point MP and the output terminal of the driver D is Lx, the distance between the turn-round point MP and the base point B is Ly.

A turn-round point SP is a turn-round point when diagonal wiring is used, and is an intersection point of vertical or horizontal wiring and the diagonal wiring. Further, the distance between the turn-round point SP and the output terminal of the driver D is SL, the distance between the turn-round point SP and the base point B in the case where they are connected by horizontal wiring is RLx, and the distance between the turn-round point SP and the base point B in the case where they are connected by vertical wiring is RLy.

Hereinbelow, the reduced length $\Delta L$ is calculated starting from FIG. 12A. FIG. 12A shows a case where a $\alpha$-degree inclination of the first diagonal wiring is at least a $\theta$-degree inclination of a line segment which connects the driver D with the base point B, where $\theta$ is 45 degrees or less. Manhattan distance between the output terminal of the driver D and the base point B is given by Lx+Ly. This is the length of wiring when the conventional wiring is used between the driver D and the base point B.

The turn-round point SP is an intersection point of a line drawn from the base point B parallel to the x-axis and the first diagonal wiring whose end point is the output terminal of the driver D. The length of wiring in the case where diagonal wiring is used is given by SL+RLx.

Therefore, the distance between the length of wiring (Lx+Ly) when the conventional wiring is used and the length of wiring (SL+RLx) when the diagonal wiring is used is the length of wiring ΔL reduced by arranging the diagonal wiring. If the reduced length of wiring ΔL is rearranged using the first diagonal wiring angle α and the distance Ly, the following is obtained.

$$\Delta L = Ly\{1-(1/\sin\alpha+1/\tan\alpha)\} \quad [\text{Formula 1}]$$

Next, FIG. 12B shows a case where a α-degree inclination of the first diagonal wiring is less than a θ-degree inclination of a line segment which connects the driver D with the base point B, where θ is 45 degrees or less. In this case, the length of wiring when the conventional wiring is used is same as that in the case of FIG. 12A. However, the length of wiring when the diagonal wiring is used is SL+RLy. If the reduced length ΔL is rearranged using the first diagonal wiring angle α and the distance Lx, the following is obtained.

$$\Delta L = Lx\{1-(1/\cos\alpha)+\tan\alpha\} \quad [\text{Formula 2}]$$

FIG. 12C shows a case where a α-degree inclination of the first diagonal wiring is at least a θ-degree inclination of a line segment which connects the driver D with the base point B, where θ is 45 degrees or more. In this case, the reduced length ΔL is given as the distance between the wiring length Lx+Ly when the conventional wiring is arranged and the wiring length SL+RLx when the diagonal wiring is used. If the reduced length ΔL is rearranged using the first diagonal wiring angle α and the distance Ly, the same result as the case of FIG. 12A is obtained.

FIG. 12D shows a case where a α-degree inclination of the first diagonal wiring is less than a θ-degree inclination of a line segment which connects the driver D with the base point B, where θ is 45 degrees or more. In this case, the reduced length ΔL is given as the distance between the wiring length Lx+Ly when the conventional wiring is arranged and the wiring length SL+RLy when the diagonal wiring is used. If the reduced length ΔL is rearranged using the first diagonal wiring angle α and the distance Lx, the same result as the case of FIG. 12B is obtained.

The above calculation method can be applied when the positional relationship between the driver and the base point is in the first quadrant and the third quadrant. When the positional relationship between the driver and the base point is in the second quadrant and the fourth quadrant, the above calculation method can be applied by switching the angle α to an angle (180-β).

Referring to FIG. 17B, the position judging portion 112 checks whether the reduced length calculated in the step S315 is a predetermined threshold or more (S316). If the reduced length exceeds the predetermined threshold, it means that an advantageous effect of arranging the diagonal wiring in the net is significant. The reason is that if the reduced length is larger, an advantageous effect of being able to reduce the delay time in the net more than the other net is expected, which leads to an improvement/increase of the operation speed in the entire semiconductor integrated circuit. Therefore, if the reduced length is the predetermined threshold or more (S316, Yes), the position judging portion 112 selects the net as an object of position judgment (S312).

On the other hand, if the reduced length is below the predetermined threshold (S316, No), the net is not selected as an object of position judgment. As a result, diagonal wiring is not arranged in the net. Once finishing the step S312, it is judged if there is an unprocessed net (S313), and the position judging portion 112 repeats the processing of the step S314 on the unprocessed net (S313, Yes). If processing all the nets is completed (S313, No), thereafter the step S51 of FIG. 16 is followed, and the processing of the position judgment and processing thereafter are performed on the net selected in the step S312.

FIG. 17C is for narrowing down the nets on which the position judgment is performed, on the basis of the maximum length between the driver and receiver in each net. First, the position judging portion 112 calculates, for each net, the longest distance between the driver and receiver (S317). The position judging portion 112 refers to the cell information stored in the storage portion 13 and the information on the drive (both in FIG. 4), and acquires the coordinates of the output terminal of the driver and the coordinates of the input terminal of the receiver. Then, the position judging portion 112 calculates Euclidean distance between the output terminal of the driver and the input terminal of the receiver to obtain the longest distance.

If the longest distance exceeds the predetermined threshold, it means that the dimension of the net is big, thus an advantageous effect of being able to reduce the delay time by arranging diagonal wiring in the net is expected. Reduction of the delay time in the net leads to an improvement/increase in the operation speed in the entire semiconductor integrated circuit. Therefore, if the longest distance is the predetermined threshold or more (S318, Yes), the position judging portion 112 selects the net as an object of position judgment (S312).

On the other hand, if the longest distance is below the predetermined threshold (S318, No), the net is not selected as an object of position judgment. As a result, diagonal wiring is not arranged in the net. Once finishing the step S312, it is judged if there is an unprocessed net (S313), and the position judging portion 112 repeats the processing of the step S317 on the unprocessed net (S313, Yes). If processing all the nets is completed (S313, No), thereafter the step S51 of FIG. 16 is followed, and the processing of the position judgment and processing thereafter are performed on the net selected in the step S312.

Figure 19B:
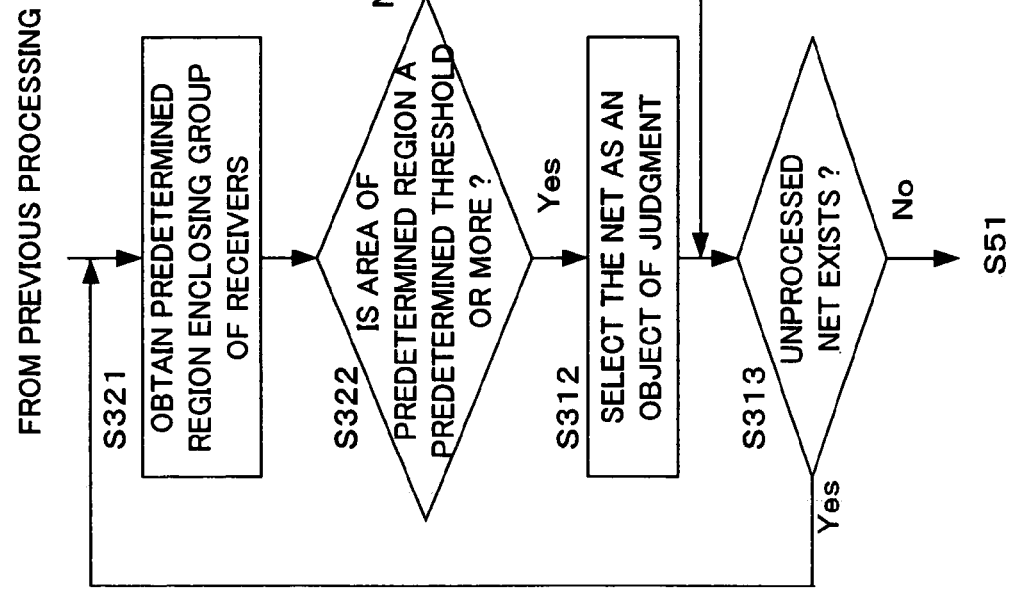
FIGS. 19A-19B are flow charts for explaining another example of the narrowing-down processing for narrowing down the nets to which diagonal wiring is applied.
Figure 19A:
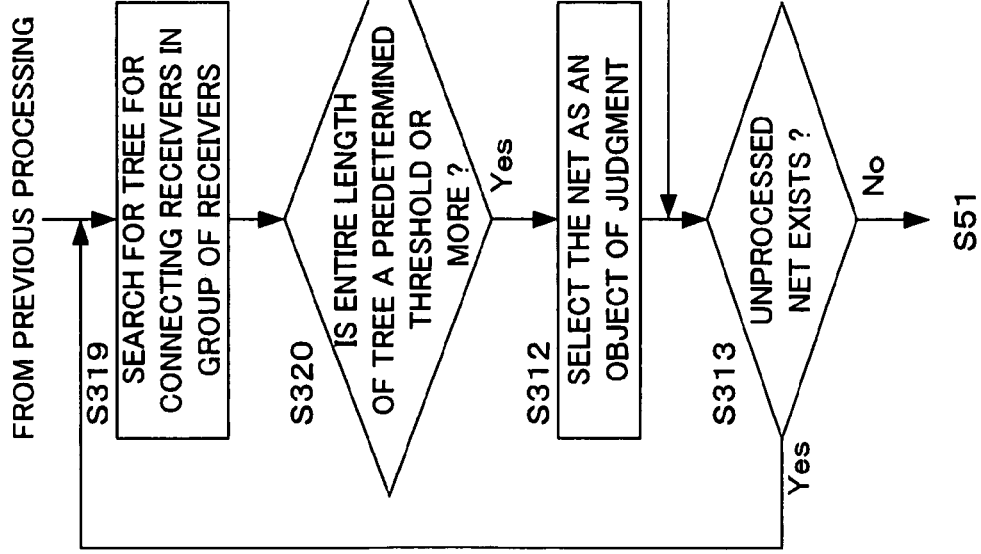

FIG. 19 is a flow chart for explaining another example of the narrowing-down processing for narrowing down the nets to which diagonal wiring is applied. FIG. 19A is for obtaining, for each net, a tree that connects all the receivers, to narrow down the net for performing position judgment on the basis of the dimension of the tree.

First of all, the position judging portion 112 searches for a tree for connecting receivers of the group of receivers, on the basis of the graph algorithm, and measures the entire length of the tree (S319). For the search method of the tree for connecting the receivers, any solution may be applied.

If the entire length of the tree exceeds a predetermined threshold, it means that the dimension of the net is big, thus an advantageous effect of being able to reduce the delay time by arranging diagonal wiring in the net is expected. Reduction of the delay time in the net leads to an improvement/increase in the operation speed in the entire semiconductor integrated circuit. Therefore, if the entire length of the tree is the predetermined threshold or more (S320, Yes), the position judging portion 112 selects the net as an object of position judgment (S312).

On the other hand, if the entire length of the tree is below the predetermined threshold (S320, No), the net is not selected as an object of position judgment. As a result, diagonal wiring is not arranged in the net. Once finishing the step S312, it is judged if there is an unprocessed net (S313), and the position judging portion 112 repeats the processing of the step S319 on the unprocessed net (S313, Yes). If processing all the nets is completed (S313, No), thereafter the step S51 of FIG. 16 is followed, and the processing of the position judgment and processing thereafter are performed on the net selected in the step S312.

FIG. 19B is for obtaining, for each net, a predetermined region for enclosing the receivers, and narrowing the nets for performing position judgment, on the basis of the area of the predetermined region.

First of all, the position judging portion 112 obtains the predetermined region for enclosing the group of receivers (S321). This processing is same as the processing performed in the position judgment (the step S51 in FIG. 8). Specifically, as shown in the example in FIG. 9, it is only necessary to obtain the smallest rectangle for enclosing the group of receivers.

If the area of the predetermined region exceeds the predetermined threshold, it is expected that the group of receivers spreads, and that the dimension of the net is big. By arranging diagonal wiring in this net, an advantageous effect of reducing the delay time is expected. Reduction of the delay time in the net leads to an improvement/increase in the operation speed in the entire semiconductor integrated circuit. Therefore, if the area of the predetermined region is the predetermined threshold or more (S322, Yes), the position judging portion 112 selects the net as an object of position judgment (S312).

On the other hand, if the area of the predetermined region is below the predetermined threshold (S322, No), the net is not selected as an object of position judgment. As a result, diagonal wiring is not arranged in the net. Once finishing the step S312, it is judged if there is an unprocessed net (S313), and the position judging portion 112 repeats the processing of the step S321 on the unprocessed net (S313, Yes). If processing all the nets is completed (S313, No), thereafter the step S51 of FIG. 16 is followed, and the processing of the position judgment and processing thereafter are performed on the net selected in the step S312.

Note that it is possible to narrow down the nets by combining the narrowing-down processing described in FIG. 17 and FIG. 19. For example, a net where the delay time is the predetermined threshold or more and the reduced length also is the predetermined threshold or more may be taken as an object of the position judgment.

Further, in the case of performing the narrowing-down processing of FIG. 17B, because the base point is determined in the step S314, the step S52 of FIG. 16, which overlaps, is omitted.

In FIG. 17 and FIG. 19, the effect of applying diagonal wiring and the dimension of the net are quantified, and a net in which the numeric value is at least a predetermined threshold is discriminated. However, a ranking position may be established in the numeric values according to the size of the numeric value so as to perform the position judgment based on this order. Examples include storing the results of sorting the numeric values from a net where the delay time is big, as a raking table.

Further, an evaluated value may be obtained by multiplying the delay time and reduced length by a weighed coefficient to perform the position judgment in descending order of the evaluated value. For example, an evaluated value can be obtained as follows: Evaluated Value=Coefficient 1×Delay Time+Coefficient 2×Reduced Length. As a result, by changing the weighted coefficients (coefficient 1, coefficient 2), it is possible to reflect a strategy of performing diagonal wiring by taking the timing as a priority or by taking relaxation of wiring congestion caused by reducing the wiring length as a priority, in the evaluated value.

Figure 20:
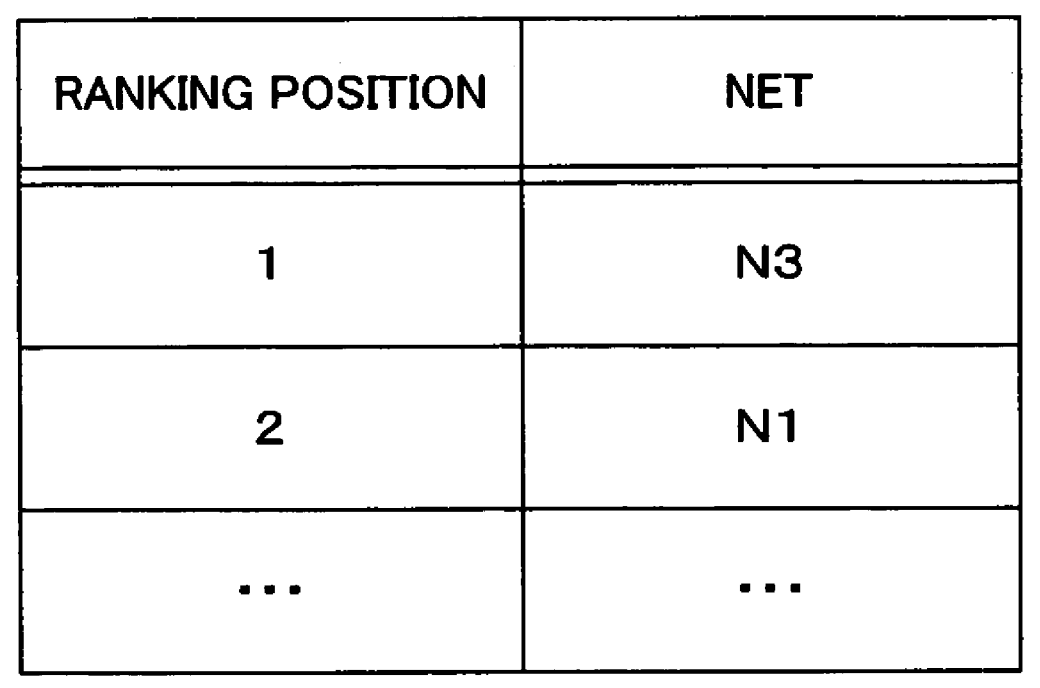

FIG. 20 is a data configuration example of a table showing the ranking positions. The raking table in FIG. 20 has data items, such as "ranking", and "net". The "ranking" indicates an order, and the "net" is an identifier for identifying a net. When the position judging portion 112,refers to the raking table of FIG. 20, for example, the judging portion 112 performs position judgment on a net N3 first, and then on a net N1. These processing may be performed as the narrowing-down processing of the step S31 of FIG. 16.

According to the second embodiment described above, in addition to the advantageous effects of the first embodiment, wiring is optimized such that diagonal wiring is arranged in a net which needs diagonal wiring on the basis of numeric values and the like that indicate the delay times or the circuit dimension. Further, the advantageous effects of arranging diagonal wiring are quantified to optimize the wiring such that diagonal wiring is arranged in a net where further advantageous effects can be expected. Moreover, a ranking position is established to optimize the wiring such that diagonal wiring is arranged by priority on the basis of the ranking.

A third embodiment will now be described. In the first and second embodiments, predetermined angles are used as the first diagonal wiring angle $\alpha$ and the second diagonal wiring angle $\beta$. In the third embodiment, on the other hand, the angle of diagonal wiring is optimized by selecting an angle where the reduced length becomes largest under the assumption that diagonal wiring is arranged.

Figure 21:
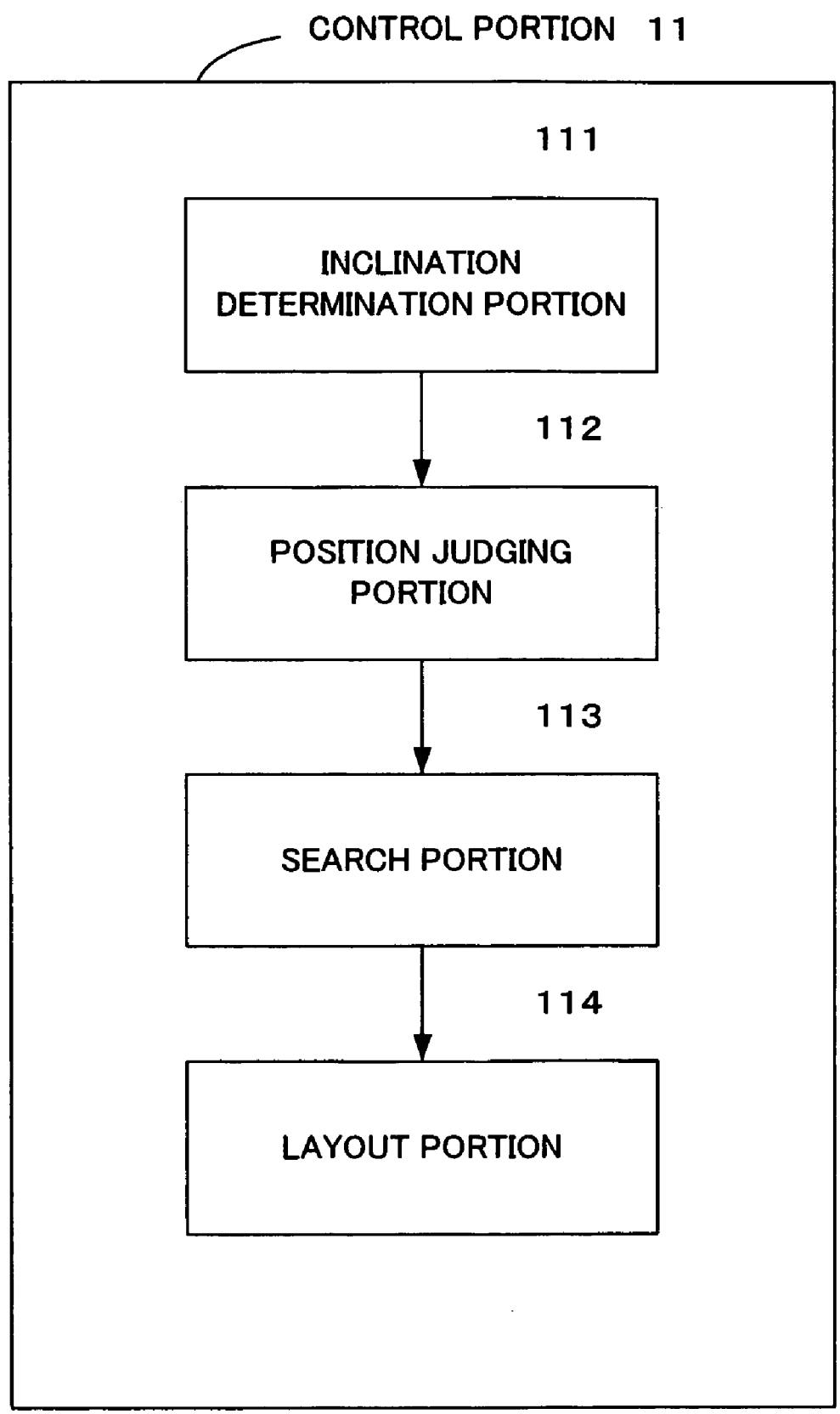
FIG. 21 is a functional block diagram for explaining the control portion of the design support apparatus in a third embodiment.

FIG. 21 is a functional block diagram for explaining the control portion 11 of the design support apparatus 1 in the third embodiment. The difference from the first embodiment is that the control portion 11 includes an inclination determination portion 111 for determining an optimal inclination of diagonal wiring. The rest is same as the functional block diagram (FIG. 7) of the control portion 11 of the first embodiment, thus the explanation thereof is omitted.

Figure 22:
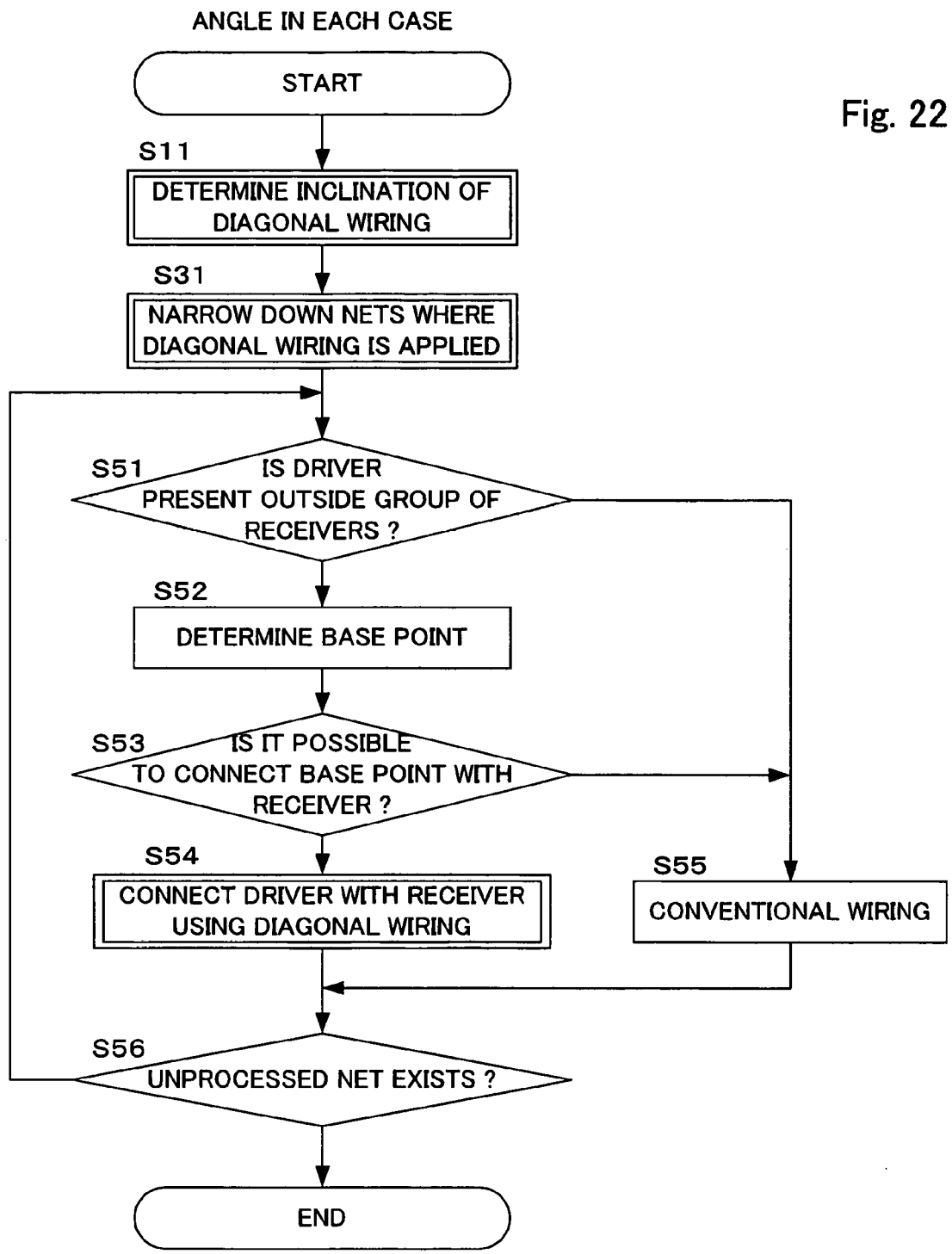
FIG. 22 is a flow chart for explaining an operation of the design support apparatus in the third embodiment.

FIG. 22 is a flow chart for explaining an operation of the design support apparatus 1 in the third embodiment. The difference from the second embodiment is that a step for determining an inclination of diagonal wiring is provided before the step S31. The rest is same as the operation flow (FIG. 16) in the second embodiment, thus the explanation thereof is omitted.

First of all, an inclination determination portion 111 determines an optimal inclination of diagonal wiring (S11). Then, once completing the step S11, the position judging portion 112 performs narrowing-down processing by using diagonal wiring having the inclination determined in the step S11 (S31), and performs position judgment on the narrowed-down nets (S51). The processing thereafter is same as that of the second embodiment (FIG. 16), thus the explanation thereof is omitted.

Figure 23:
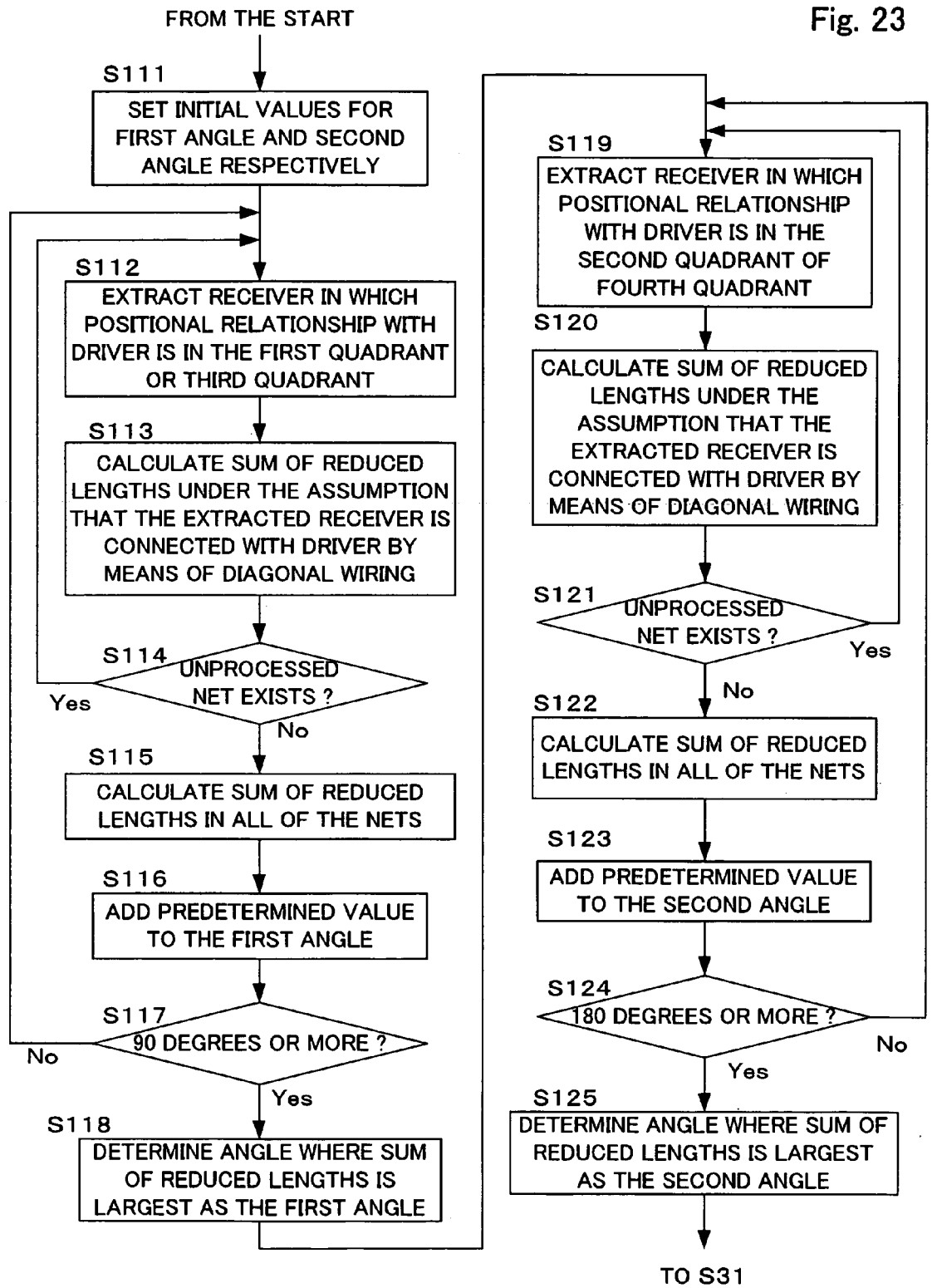
FIG. 23 is a flow chart for explaining an example of inclination determination processing for determining an optimal inclination of diagonal wiring.

FIG. 23 is a flow chart for explaining an example of the inclination determination processing for determining an optimal inclination of diagonal wiring of the step S11 of FIG. 22. Here, the $\alpha$-degree inclination of the first diagonal wiring ($0<\alpha<90$) and the $\beta$-degree inclination of the second diagonal wiring ($90<\beta<180$) shown in FIG. 5 are optimized.

First of all, the inclination determination portion 111 sets initial values for the inclination of the first diagonal wiring (first angle) and the inclination of the second diagonal wiring (second wiring) (S111). For example, suppose that an initial value of the first angle is 1 degree and an initial value of the second angle is 91 degrees, and thereafter, each degree is changed one degree at a time. First, the first angle is optimized.

The inclination determination portion 111 extracts a receiver where the positional relationship with the driver belongs to the first quadrant or third quadrant (S112). The inclination determination portion 111 acquires the coordinates of the driver and receiver contained in each net by referring to the cell information and drive relationship information (FIG. 4) stored in the storage portion 13.

Then, by moving the coordinate in parallel such that the driver is set as an original point as shown in FIG. 5A, the quadrant to which the receiver belongs is determined by looking at the x- and y-coordinates. The receiver belongs to the first quadrant if the both x- and y-coordinates are positive. Similarly, the receiver belongs to the second quadrant if the x-coordinate is negative and y-coordinate is positive, to the third quadrant if the both x- and y-coordinates are negative; and to the fourth quadrant if the x-coordinate is positive and y-coordinate is negative.

As above, once extracting a receiver that belongs to the first quadrant or third quadrant, the inclination determination portion 111 calculates, for each net, a total of the reduced lengths when connecting the extracted receiver with the driver by means of diagonal wiring (S113). The calculation method for the reduced length in the step S113 is as explained in the step S315 in the narrowing-down processing of FIG. 17B. However, in the narrowing-down processing, although the reduced length between the driver and the base point which represents the group of receivers is calculated, the difference from this is that here the reduced length is obtained for each receiver and the driver.

The inclination determination portion 111 judges whether or not an unprocessed net exists, and if there is one (S114, Yes), returns to the step S112 to continue the processing. Once calculating the reduced length in the case where diagonal wiring with the initial values set in the step S111 are used (S114, No), the total values of the reduced length of the entire nets are calculated, which is then corresponded to the first angle (initial value set in the step S111) and stored in the storage potion 13 (S115).

Further, the inclination determination portion 111 adds a predetermined value to the first angle (S116). The inclination determination portion 111 adds, for example, one degree. If the first angle after being added with the predetermined value is less than 90 degrees (S117, No), the inclination determination portion 111 continues the processing from the step S112 by using the newly obtained first angle.

If the first angle becomes 90 degrees or more (S117, Yes), the inclination determination portion 111 refers to the storage portion 13 and determines the angle where the reduced length corresponding to each changed angle is maximum as the first angle (S118). Consequently the first angle is optimized. The second angle is optimized in a similar way.

The inclination determination portion 111 extracts a receiver where the positional relationship with the driver belongs to the second quadrant or fourth quadrant (S119). This processing is carried out in the same was as the step S112. Once extracting a receiver that belongs to the second quadrant or fourth quadrant, the inclination determination portion 111 calculates, for each net, a total of the reduced lengths when connecting the extracted receiver with the driver by means of diagonal wiring (S120). The processing of the step S120 is same as that of the step S113.

The inclination determination portion 111 judges whether or not an unprocessed net exists, and if there is one (S121, Yes), returns to the step S119 to continue the processing. Once calculating the reduced length in the case where diagonal wiring with the initial values set in the step S111 are used (S121, No), the total values of the reduced length of the entire nets are calculated, which is then corresponded to the second angle (initial value set in the step S111) and stored in the storage potion 13 (S122).

Further, the inclination determination portion 111 adds a predetermined value to the second angle (S123). The inclination determination portion 111 adds, for example, one degree. If the second angle after being added with the predetermined value is less than 180 degrees (S124, No), the inclination determination portion 111 continues the processing from the step S119 by using the newly obtained second angle.

If the second angle becomes 180 degrees or more (S124, Yes), the inclination determination portion 111 refers to the storage portion 13 and determines the angle where the reduced length corresponding to each changed angle is maximum as the second angle (S125). The second angle is optimized as above.

According to the third embodiment described above, upon optimization of the inclination of the diagonal wiring in accordance with the arrangement of the cells, the operations of the first embodiment and second embodiment can be performed by the design support apparatus 1, whereby the effectiveness using diagonal wiring can be further increased.

Although the first to third embodiments explained the case where two types of diagonal wiring with different inclination angles are used, the embodiments can be applied also when using one type of diagonal wiring.

Figure 24B:
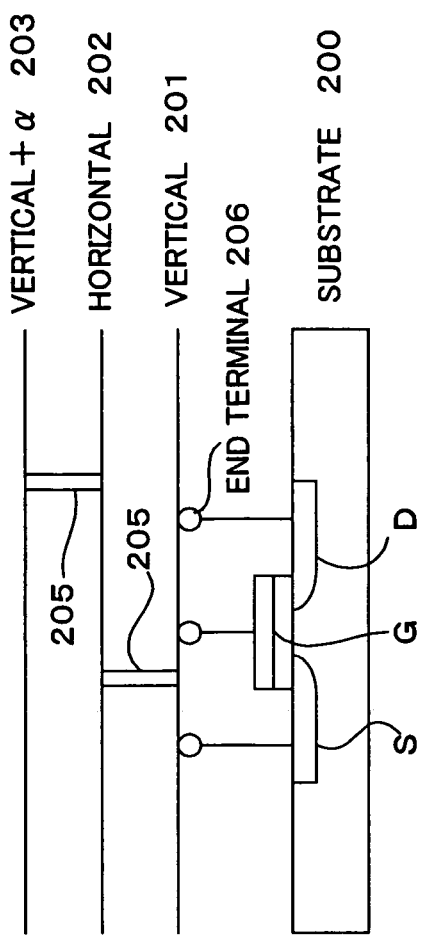
FIGS. 24A-24B are figures showing wiring when using only the first diagonal wiring.
Figure 24A:
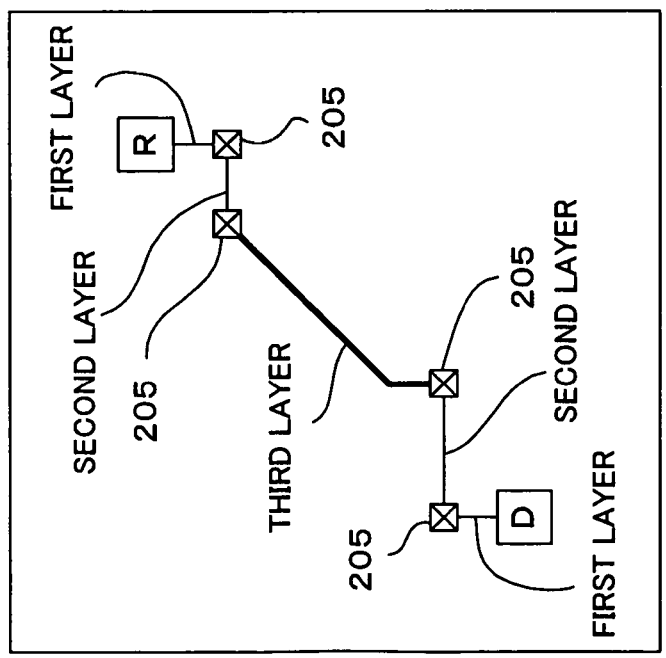

FIG. 24 is a figure showing wiring when using only the first diagonal wiring. As shown in FIG. 24, when using only α-degree diagonal wiring (0<α<90), the diagonal wiring is used when the positional relationship between the driver and base point is in the first quadrant or the third quadrant. In other cases, the conventional wiring may be performed y means of vertical and/or horizontal wiring.

Summary of the above descriptions is as described in the appended claims.

What is claimed is:

1. A design support apparatus supporting a design of an integrated circuit which includes a plurality of cells to implement different functions by combining a plurality of logical gates, comprising:

a storage portion in which is stored a layout program which determines a wiring layout when connecting the plurality of cells employing diagonal wiring having an inclination determined beforehand; and a control portion which reads and executes said layout program from said storage portion, wherein said storage portion further contains position information for specifying a position in which said plurality of cells are arranged, and wherein said control portion executes said layout program to implement:

a position judging section which performs position judgment to check, for every net, the net being formed by a first cell to be called 'driver' and one or a plurality of cells driven via an output terminal of the first cell to be called 'receiver(s)', whether or not said driver exists outside a predetermined region for enclosing said receiver(s); and a layout section which determines a base point from an inside of said predetermined region, with respect to said net when it is judged that said driver exists outside said predetermined region, and arranges said diagonal wiring for wiring which connects said output terminal of said driver with said base point when said base point can be connected with an input terminal of said receiver by means of vertical and/or horizontal wiring.

2. The design support apparatus according to claim 1, wherein said control portion further executes said layout program to implement a search section which:
determines the direction of wiring adjacent to said diagonal wiring as vertical or horizontal wiring, based on an inclination of a line segment that connects said output terminal of said driver with said base point, and on an inclination of said diagonal wiring; and
performs a search to find a range in which said diagonal wiring can be arranged by moving said diagonal wiring in parallel in said determined adjacent wiring direction and
wherein said layout section:
assumes that said diagonal wiring is temporarily arranged in a position selected in said searched range;
performs connection judgment to check if it is possible to connect, of the two end points of said temporarily arranged diagonal wiring, an end point near said driver with said output terminal of said driver, and an end point near said base point with said base point, by means of vertical and/or horizontal wiring; and
arranges said diagonal wiring in the selected position if it is possible to make said connection.

3. The design support apparatus according to claim 2, wherein:
said search section starts said search by taking a length of said diagonal wiring as a preset predetermined initial value, and
when there is no range in which said diagonal wiring can be arranged, said search section makes the length of said diagonal wiring shorter than said predetermined initial value, and performs a search again.

4. The design support apparatus according to claim 3, wherein:
said search section stops said search when the length of said diagonal wiring is a first threshold or less.

5. The design support apparatus according to claim 1, wherein:
said predetermined region is the smallest rectangle which encloses said one or a plurality of receivers.

6. The design support apparatus according to claim 1, wherein:
when said driver is connected with said receivers by means of vertical and/or horizontal wiring, a delay time generated in each path between said driver and said receiver is calculated for said every net, and
said position judging section takes as an object of said position judgment, of said plurality of nets, said net having said path in which said delay time is at least a second threshold.

7. The design support apparatus according to claim 1, wherein:
when said driver is connected with said receivers by means of vertical and/or horizontal wiring, a delay time generated in each path between said driver and said receiver is calculated for said every net, and
said position judging section performs said position judgment on said net in descending order of said delay time.

8. The design support apparatus according to claim 1, wherein:
the difference between a Manhattan distance from said driver to said base point and wiring length when connecting said driver with said base point by means of wiring using said diagonal wiring is calculated for said every net, and
said position judgment section takes as an object of said position judgment, of said plurality of nets, said net in which said difference is at least a third threshold.

9. The design support apparatus according to claim 1, wherein:
the difference between a Manhattan distance from said driver to said base point and wiring length when connecting said driver with said base point by means of wiring using said diagonal wiring is calculated for said every net, and
said position judging section performs said position judgment on said net in descending order of said difference.

10. The design support apparatus according to claim 1, wherein:
a delay time generated in each path between said driver and said receiver when said driver is connected with said receivers by means of vertical and/or horizontal wiring, and the difference between a Manhattan distance from said driver to said base point and wiring length when connecting said driver with said base point by means of wiring using said diagonal wiring, are calculated for every said net, and
said position judging section establishes rank of said nets on the basis of an evaluated value calculated by multiplying said delay time and said difference by a weighed coefficient, and performs position judgment on said net in descending order of said ranking positions.

11. The design support apparatus according to claim 1, wherein:
said position judging section calculates, for said every net, the longest distance from said driver to said receiver contained in the net, and takes as an object of said position judgment, of said plurality of nets, the net in which said longest distance is at least a fourth threshold.

12. The design support apparatus according to claim 1, wherein:
said position judging section searches for a tree for connecting said one or a plurality of receivers contained in the net, calculates the entire length of said tree for said every net, and takes said net in which said entire length is at least a fifth threshold as an object of said position judgment.

13. The design support apparatus according to claim 1, wherein:
said position judging section calculates the area of said predetermined region for said every net, and takes the net in which said area is at least a sixth threshold as an object of said position judgment.

14. The design support apparatus according to claim 1, wherein:
said wiring layout is determined in a two-dimensional plane formed by the x- and y-axes that are mutually perpendicular,
said diagonal wiring has first diagonal wiring making a $\alpha$-degree angle ($0<\alpha<90$) with respect to said x-axis, and second diagonal wiring making a $\beta$-degree angle ($90<\beta<180$) with respect to said x-axis; and
said layout section uses said first diagonal wiring if an angle made by a line segment connecting said output terminal of said driver with said base point with respect to said x-axis is larger than 0 degree and smaller than 90 degrees, and uses said second diagonal wiring if the angle made by the line segment with respect to said x-axis is larger than 90 degrees.

15. The design support apparatus according to claim 1, wherein:
the inclination of said first diagonal wiring is an inclination which, when changing the inclination of said first diagonal wiring to calculate a first total value, maximizes said first total value,
the inclination of said second diagonal wiring is an inclination which, when changing the inclination of said second diagonal wiring to calculate a second total value, maximizes said second total value,
said first total value is calculated, in said plurality of nets, as a total value of the difference between a Manhattan distance from said output terminal of said driver to said base point satisfying a first condition and the length of wiring for connecting said driver with the base point satisfying the first condition by using the first diagonal wiring whose inclination is fixed, said first condition being that an angle made by a line segment connecting said output terminal of said driver with said base point with respect to said x-axis is larger than 0 degree and smaller than 90 degrees when the inclination of said first diagonal wiring is fixed, and
said second total value is calculated, in said plurality of nets, as a total value of the difference between a Manhattan distance from said output terminal of said driver to said base point satisfying a second condition and the length of wiring for connecting said driver with the base point satisfying the second condition by using the second diagonal wiring whose inclination is fixed, said second condition being that an angle made by a line segment connecting said output terminal of said driver with said base point with respect to said x-axis is larger than 90 degrees when the inclination of said second diagonal wiring is fixed.

16. A design support apparatus supporting a design of an integrated circuit which includes a plurality of cells to implement different functions by combining a plurality of logical gates, on connecting the plurality of cells by means of diagonal wiring whose inclination is determined beforehand, comprising:
a storage portion in which is stored position information for specifying a position where said plurality of cells are arranged;
a position judging portion which, which performs position judgment to check, for every net, the net being formed by a first cell to be called 'driver' and one or a plurality of cells driven via an output terminal of the first cell to be called 'receiver(s)', whether or not said driver exists outside a predetermined region for enclosing said receiver(s); and
a layout portion which determines a base point from an inside of said predetermined region, with respect to said net where it is judged that said driver exists outside said predetermined region, and arranges said diagonal wiring for wiring which connects said output terminal of said driver with said base point when said base point can be connected with an input terminal of said receiver by means of vertical and/or horizontal wiring.

17. The design support apparatus according to claim 16, further comprising a search portion which determines the direction of wiring adjacent to said diagonal wiring as vertical or horizontal wiring, based on an inclination of a line segment that connects said output terminal of said driver with said base point, and on an inclination of said diagonal wiring, and performs a search to find a range in which said diagonal wiring can be arranged by moving said diagonal wiring in parallel in said determined adjacent wiring direction, and wherein said layout portion:
assumes that said diagonal wiring is arranged in a position selected in said searched range;
performs connection judgment to check if it is possible to connect, of the two end points of said temporarily arranged diagonal wiring, an end point near said driver with said output terminal of said driver, and an end point near said base point with said base point, by means of vertical and/or horizontal wiring; and
arranges said diagonal wiring in the selected position if it is possible to make said connection.

18. A computer-readable medium storing a program executed by a computer for determining a wiring layout of an integrated circuit which includes a plurality of cells to implement different functions by combining a plurality of logical gates when connecting the plurality of cells by means of diagonal wiring whose inclination is determined beforehand, said program causing the computer to execute a method comprising:
performing position judgment to check, for every net, the net being formed by a first cell to be called 'driver' and one or a plurality of cells driven via an output terminal of the first cell to be called 'receiver(s)', whether or not said driver exists outside a predetermined region for enclosing said receiver(s), based on position information stored in advance for specifying a position where said plurality of cells are arranged;
determining a base point from an inside of said predetermined region, with respect to said net where it is judged that said driver exists outside said predetermined region; and
arranging said diagonal wiring for wiring which connects said output terminal of said driver with said base point when said base point can be connected with an input terminal of said receiver by means of vertical and/or horizontal wiring.

19. The computer-readable medium according to claim 18, said arranging further comprising:
determining the direction of wiring adjacent to said diagonal wiring as vertical or horizontal wiring, based on an inclination of a line segment that connects said output terminal of said driver with said base point, and on an inclination of said diagonal wiring;
performing a search to find a range in which said diagonal wiring can be arranged by moving said diagonal wiring in parallel in said determined adjacent wiring direction;
assuming that said diagonal wiring is temporarily arranged in a position selected in said searched range;
performing connection judgment to check if it is possible to connect, of the two end points of said temporarily arranged diagonal wiring, an end point near said driver with said output terminal of said driver, and an end point near said base point with said base point, by means of vertical and/or horizontal wiring; and
arranging said diagonal wiring in the selected position if it is possible to make said connection.

20. The computer-readable medium according to claim 19, wherein:
said search is started by taking a length of said diagonal wiring as a preset predetermined initial value, and
when there is no range in which said diagonal wiring can be arranged, the search is again performed after the length of said diagonal wiring is made shorter than said predetermined initial value.

21. The computer-readable medium according to claim 20, wherein:
said search is stopped when the length of said diagonal wiring is a first threshold or less.

22. The computer-readable medium according to claim 18, wherein:
said predetermined region is the smallest rectangle for enclosing said one or a plurality of receivers.

23. The computer-readable medium according to claim 18, wherein:
when said driver is connected with said receivers by means of vertical and/or horizontal wiring, a delay time generated in each path between said driver and said receiver is calculated for every said net, and
of said plurality of nets, said net having said path in which said delay time is at least a second threshold is taken as an object of said position judgment.

24. The computer-readable medium according to claim 18, wherein:
when said driver is connected with said receivers by means of vertical and/or horizontal wiring, a delay time generated in each path between said driver and said receiver is calculated for said every net, and
said position judgment is performed on said net in descending order of said delay time.

25. The computer-readable medium according to claim 18, wherein:
the difference between a Manhattan distance from said driver to said base point and wiring length when connecting said driver with said base point by means of wiring using said diagonal wiring is calculated for said every net, and
of said plurality of nets, said net in which said difference is at least a third threshold is taken as an object of said position judgment.

26. The computer-readable medium according to claim 18, wherein:
the difference between a Manhattan distance from said driver to said base point and wiring length when connecting said driver with said base point by means of wiring using said diagonal wiring is calculated for said every net, and
said position judgment is performed on said net in descending order of said difference.

27. The computer-readable medium according to claim 18, wherein:
a delay time generated in each path between said driver and said receiver when said driver is connected with said receivers by means of vertical and/or horizontal wiring, and the difference between a Manhattan distance from said driver to said base point and wiring length when connecting said driver with said base point by means of wiring using said diagonal wiring, are calculated for every said net,
ranking positions of said nets are established on the basis of an evaluated value calculated by multiplying said delay time and said difference by a weighed coefficient, and
position judgment is per-formed on said net in descending order of said ranking positions.

28. The computer-readable medium according to claim 18, wherein:
the longest distance from said driver to said receiver contained in said net is calculated for every said net, and
of said plurality of nets, said net in which said longest distance is at least a fourth threshold is taken as an object of said position judgment.

29. The computer-readable medium according to claim 18, wherein:
a tree for connecting said one or a plurality of receivers contained in said net is searched,
the entire length of said tree for every said net is calculated, and
said net in which said entire length is at least a fifth threshold is taken as an object of said position judgment.

30. The computer-readable medium according to claim 18, wherein:
the area of said predetermined region for said every net is calculated, and
said net in which said area is at least a sixth threshold is taken as an object of said position judgment.

31. The computer-readable medium according to claim 18, wherein:
said wiring layout is determined in a two-dimensional plane formed by the x- and y-axes that are mutually perpendicular,
said diagonal wiring comprises first diagonal wiring making a $\alpha$-degree angle ($0<\alpha<90$) with respect to said x-axis, and second diagonal wiring making a $\beta$-degree angle ($90<\beta<180$) with respect to said x-axis, and
said first diagonal wiring is used if an angle made by a line segment connecting said output terminal of said driver with said base point with respect to said x-axis is larger than 0 degree and smaller than 90 degrees, and said second diagonal wiring is used if the angle made by the line segment with respect to said x-axis is larger than 90 degrees.

32. The computer-readable medium according to claim 18, wherein:
the inclination of said first diagonal wiring is an inclination which, when changing the inclination of said first diagonal wiring to calculate a first total value, maximizes said first total value,
the inclination of said second diagonal wiring is an inclination which, when changing the inclination of said second diagonal wiring to calculate a second total value, maximizes said second total value,
said first total value is calculated, in said plurality of nets, as a total value of the difference between a Manhattan distance from said output terminal of said driver to said base point satisfying a first condition and the length of wiring for connecting said driver with the base point satisfying the first condition by using the first diagonal wiring whose inclination is fixed, said first condition being that an angle made by a line segment connecting said output terminal of said driver with said base point with respect to said x-axis is larger than 0 degree and smaller than 90 degrees when the inclination of said first diagonal wiring is fixed, and
said second total value is calculated, in said plurality of nets, as a total value of the difference between a Manhattan distance from said output terminal of said driver to said base point satisfying a second condition and the length of wiring for connecting said driver with the base point satisfying the second condition by using the second diagonal wiring whose inclination is fixed, said second condition being that an angle made by a line segment connecting said output terminal of said driver with said base point with respect to said x-axis is larger than 90 degrees when the inclination of said second diagonal wiring is fixed.

33. A design support method for determining a wiring layout of an integrated circuit which includes a plurality of cells to implement different functions by combining a plurality of logical gates when connecting the plurality of cells by means of diagonal wiring whose inclination is determined beforehand, the design support method comprising:

performing position judgment to check, for every net, the net being formed by a first cell to be called 'driver' and one or a plurality of cells driven via an output terminal of the first cell to be called 'receiver(s)', whether or not said driver exists outside a predetermined region for enclosing said receiver(s), based on position information stored in advance for specifying a position where said plurality of cells are arranged;

determining a base point from an inside of said predetermined region, with respect to said net where it is judged that said driver exists outside said predetermined region; and arranging said diagonal wiring for wiring which connects said output terminal of said driver with said base point when said base point can be connected with an input terminal of said receiver by means of vertical and/or horizontal wiring.

34. The design support method according to claim 33, said arranging further comprising:

determining the direction of wiring adjacent to said diagonal wiring as vertical or horizontal wiring, based on an inclination of a line segment that connects said output terminal of said driver with said base point, and on an inclination of said diagonal wiring;

performing a search to find a range in which said diagonal wiring can be arranged by moving said diagonal wiring in parallel in said determined adjacent wiring direction;

assuming that said diagonal wiring is temporarily arranged in a position selected in said searched range;

performing connection judgment to check if it is possible to connect, of the two end points of said temporarily arranged diagonal wiring, an end point near said driver with said output terminal of said driver, and an end point near said base point with said base point, by means of vertical and/or horizontal wiring; and arranging said diagonal wiring in the selected position if it is possible to make said connection.

35. The design support method according to claim 34, wherein:

said search is started by taking a length of said diagonal wiring as a preset predetermined initial value, and when there is no range in which said diagonal wiring can be arranged, the search is again performed after the length of said diagonal wiring is made shorter than said predetermined initial value.

36. The design support method according to claim 35, wherein:

said search is stopped when the length of said diagonal wiring is a first threshold or less.

37. The design support method according to claim 33, wherein:

said predetermined region is the smallest rectangle for enclosing said one or a plurality of receivers.

38. The design support method according to claim 33, wherein:

when said driver is connected with said receivers by means of vertical and/or horizontal wiring, a delay time generated in each path between said driver and said receiver is calculated for every said net, and of said plurality of nets, said net having said path in which said delay time is at least a second threshold is taken as an object of said position judgment.

39. The design support method according to claim 33, wherein: when said driver is connected with said receivers by means of vertical and/or horizontal wiring, a delay time generated in each path between said driver and said receiver is calculated for said every net, and said position judgment is performed on said net in descending order of said delay time.

40. The design support method according to claim 33, wherein:

the difference between a Manhattan distance from said driver to said base point and wiring length when connecting said driver with said base point by means of wiring using said diagonal wiring is calculated for said every net, and of said plurality of nets, said net in which said difference is at least a third threshold is taken as an object of said position judgment.

41. The design support method according to claim 33, wherein:

the difference between a Manhattan distance from said driver to said base point and wiring length when connecting said driver with said base point by means of wiring using said diagonal wiring is calculated for said every net, and said position judgment is performed on said net in descending order of said difference.

42. The design support method according to claim 33, wherein:

a delay time generated in each path between said driver and said receiver when said driver is connected with said receivers by means of vertical and/or horizontal wiring, and the difference between a Manhattan distance from said driver to said base point and wiring length when connecting said driver with said base point by means of wiring using said diagonal wiring, are calculated for every said net, ranking positions of said nets are established on the basis of an evaluated value calculated by multiplying said delay time and said difference by a weighed coefficient, and position judgment is performed on said net in descending order of said ranking positions.

43. The design support method according to claim 33, wherein:

the longest distance from said driver to said receiver contained in said net is calculated for every said net, and of said plurality of nets, said net in which said longest distance is at least a fourth threshold is taken as an object of said position judgment.

44. The design support method according to claim 33, wherein:

a tree for connecting said one or a plurality of receivers contained in said net is searched, the entire length of said tree for every said net is calculated, and said net in which said entire length is at least a fifth threshold is taken as an object of said position judgment.

45. The design support method according to claim 33, wherein:

the area of said predetermined region for every said net is calculated, and said net in which said area is at least a sixth threshold is taken as an object of said position judgment.

46. The design support method according to claim 33, wherein:

said wiring layout is determined in a two-dimensional plane formed by the x- and y-axes that are mutually perpendicular, said diagonal wiring comprises first diagonal wiring making a $\alpha$-degree angle ($0<\alpha<90$) with respect to said x-axis, and second diagonal wiring making a $\beta$-degree angle ($90<\beta<180$) with respect to said x-axis, and said first diagonal wiring is used if an angle made by a line segment connecting said output terminal of said driver with said base point with respect to said x-axis is larger than 0 degree and smaller than 90 degrees, and said second diagonal wiring is used if the angle made by the line segment with respect to said x-axis is larger than 90 degrees.

47. The design support method according to claim 33, wherein:

the inclination of said first diagonal wiring is an inclination which, when changing the inclination of said first diagonal wiring to calculate a first total value, maximizes said first total value, the inclination of said second diagonal wiring is an inclination which, when changing the inclination of said second diagonal wiring to calculate a second total value, maximizes said second total value, said first total value is calculated, in said plurality of nets, as a total value of the difference between a Manhattan distance from said output terminal of said driver to said base point satisfying a first condition and the length of wiring for connecting said driver with the base point satisfying the first condition by using the first diagonal wiring whose inclination is fixed, said first condition being that an angle made by a line segment connecting said output terminal of said driver with said base point with respect to said x-axis is larger than 0 degree and smaller than 90 degrees when the inclination of said first diagonal wiring is fixed, and said second total value is calculated, in said plurality of nets, as a total value of the difference between a Manhattan distance from said output terminal of said driver to said base point satisfying a second condition and the length of wiring for connecting said driver with the base point satisfying the second condition by using the second diagonal wiring whose inclination is fixed, said second condition being that an angle made by a line segment connecting said output terminal of said driver with said base point with respect to said x-axis is larger than 90 degrees when the inclination of said second diagonal wiring is fixed.

* * * * *

UNITED STATES PATENT AND TRADEMARK OFFICE
CERTIFICATE OF CORRECTION

| | | |
|---|---|---|
| PATENT NO. | : 7,328,422 B2 | Page 1 of 1 |
| APPLICATION NO. | : 11/059556 | |
| DATED | : February 5, 2008 | |
| INVENTOR(S) | : Noriyuki Ito et al. | |

It is certified that error appears in the above-identified patent and that said Letters Patent is hereby corrected as shown below:

Column 25, Line 48, delete "which,".

Column 27, Line 61, change "per-formed" to --performed--.

Signed and Sealed this

Nineteenth Day of August, 2008

JON W. DUDAS
*Director of the United States Patent and Trademark Office*